(12) United States Patent
Morishita

(10) Patent No.: US 6,392,292 B1
(45) Date of Patent: May 21, 2002

(54) MULTI-LEVEL STACKED SEMICONDUCTOR BEAR CHIPS WITH THE SAME ELECTRODE PAD PATTERNS

(75) Inventor: Yoshiaki Morishita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/611,830

(22) Filed: Jul. 7, 2000

(30) Foreign Application Priority Data

Jul. 8, 1999 (JP) ............................................ 11-193963

(51) Int. Cl.⁷ .............................................. H01L 23/02
(52) U.S. Cl. ...................................... 257/686; 438/109
(58) Field of Search ............................. 257/686, 777, 257/698, 723, 724, 774, 773, 780, 779

(56) References Cited

U.S. PATENT DOCUMENTS

| | | | |
|---|---|---|---|
| 5,261,115 A | * 11/1993 | Saunders et al. | 395/800 |
| 5,373,189 A | * 12/1994 | Massit et al. | 257/686 |
| 5,903,049 A | * 5/1999 | Mori | 257/686 |
| 6,141,245 A | * 10/2000 | Bertin et al. | 365/185.05 |
| 6,147,398 A | * 11/2000 | Nakazato et al. | 257/696 |

FOREIGN PATENT DOCUMENTS

JP 2870530 1/1999

* cited by examiner

Primary Examiner—David Nelms
Assistant Examiner—Tu-Tu Ho
(74) Attorney, Agent, or Firm—Scully, Scott, Murphy & Presser

(57) ABSTRACT

The present invention provides a semiconductor device comprising a plurality of semiconductor bear chips staked over a substrate, each of the semiconductor bear chips having top and bottom surfaces, each of the top and bottom surfaces of each of the semiconductor bear chips having both plural signal pads and plural chip select pads, wherein the plural chip select pads are aligned at a constant pitch in a first direction, and adjacent two of the plural semiconductor bear chips are displaced by a first distance corresponds to the constant pitch in the first direction.

26 Claims, 9 Drawing Sheets

MULTI-LEVEL STACKED SEMICONDUCTOR BEAR CHIPS WITH THE SAME ELECTRODE PAD PATTERNS

BACKGROUND OF THE INVENTION

The present invention relates to a semiconductor device, and more particularly to a semiconductor device having a multi-level staked structure of plural staked semiconductor bear chips such as IC or LSI, wherein the plural staked semiconductor bear chips have the same external electrode patterns as each other.

A dual line memory module (DIMM) structure has been used for mounting a plurality of semiconductor packages. FIG. 1 is a schematic perspective view illustrative of a dual line memory module (DIMM) structure for mounting a plurality of semiconductor packages. In accordance with the dual line memory module (DIMM) structure, plural semiconductor packages 101 such as TSOPs (thin small outline packages) and CSPs are packaged in parallel on both top and bottom surfaces of a dual line memory module substrate 100. In order to reduce the packaging area, it is effective that each of the semiconductor packages 101 has a multilevel stacked structure of plural semiconductor packages stacked.

If each of the semiconductor packages 101 has a multi-level stacked structure of plural semiconductor packages stacked, a multilevel interconnection layout is necessary. To make this multilevel interconnection layout, it is further necessary that the multilevel stacked semiconductor packages are different from each other in interconnection layout of address lines and data lines, whereby the bottom level semiconductor package are likely to have increased numbers of through holes and external terminals. This means that the design or layout of the stacked semiconductor chips varies depending upon the number of the levels of the stacked semiconductor chips. The multilevel stacked structure makes it inefficient to conduct the design and manufacturing.

It has been proposed that in order to realize the efficient design and manufacturing, selectable signal lines or chip select signal lines are used throughout the multilevel for making the address lines and data lines common on the individual levels for unification to the electrode patterns and interconnection patterns and to the number of the signal lines throughout the multilevels. One example of the stacked modules of this type is disclosed in Japanese patent no. 2870530. FIG. 2 is a schematic perspective view illustrative of a conventional stacked module of plural memory bear chips mounted on interposers stacked in multilevels. Plural memory bear chips 105 are mounted on interposers 106. The interposers 106 are stacked in the form of multilevels. The stacked interposers 106 are electrically connected to each other through solder balls 107.

Each of the interposers 106 is provided with chip select signal lines for selecting a level, on which the memory bear chip should execute a read or write commend. The chip select signal lines are laid out so that the address lines and data lines of the memory bear chips 105 and the interposers 106 are made common.

For the above conventional technique, the interposers 106 are essential for unifying the interconnection patterns from the external electrodes of the individual semiconductor bear chips. In the prior art, there was no technique to realize the multilevel structure of only the semiconductor bear chips without using the interposers for the purpose of unifying the interconnection patterns from the external electrodes of the individual semiconductor bear chips.

Further, the requirement for reduction in thickness of the semiconductor bear chips has been on the increase, whereby it has been necessary that a gap between adjacent two of the stacked semiconductor bear chips is as narrow as possible. This narrowed gap between adjacent two of the stacked semiconductor bear chips makes it difficult to conduct the required test for certain connections between the individual stacked semiconductor bear chips by use of a probe.

In the above circumstances, it had been required to develop a novel semiconductor device having an improved multilevel stacked structure free from the above problem.

SUMMARY OF THE INVENTION

Accordingly, it is an object of the present invention to provide a novel semiconductor device having an improved multilevel stacked structure free from the above problems.

It is a further object of the present invention to provide a novel semiconductor device having an improved multilevel stacked structure allowing unification of electrode patterns and interconnection layout throughout multilevel stacked semiconductor bear chips.

It is a still further object of the present invention to provide a novel semiconductor device having an improved multilevel stacked structure allowing efficient use of signal lines in stacking plural semiconductor bear chips.

It is yet a further object of the present invention to provide a novel semiconductor device having an improved multi-level stacked structure allowing a test for certain connections between multilevel stacked semiconductor bear chips.

The present invention provides a semiconductor device comprising a plurality of semiconductor bear chips staked over a substrate, each of the semiconductor bear chips having top and bottom surfaces, each of the top and bottom surfaces of each of the semiconductor bear chips having both plural signal pads and plural chip select pads, wherein the plural chip select pads are aligned at a constant pitch in a first direction, and adjacent two of the plural semiconductor bear chips are displaced by a first distance corresponds to the constant pitch in the first direction.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
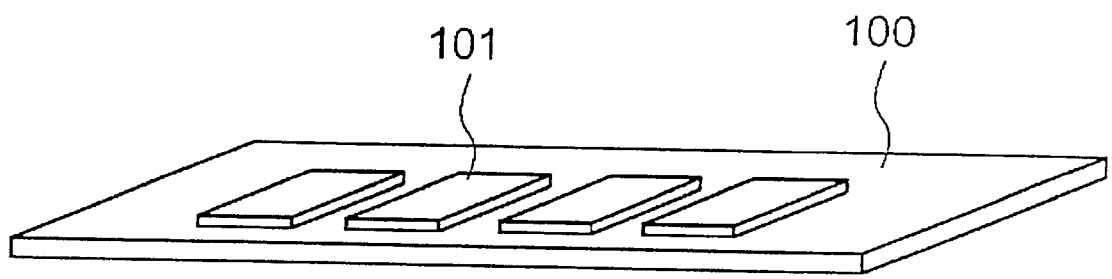
FIG. 1 is a schematic perspective view illustrative of a dual line memory module (DIMM) structure for mounting a plurality of semiconductor packages.
Figure 2:
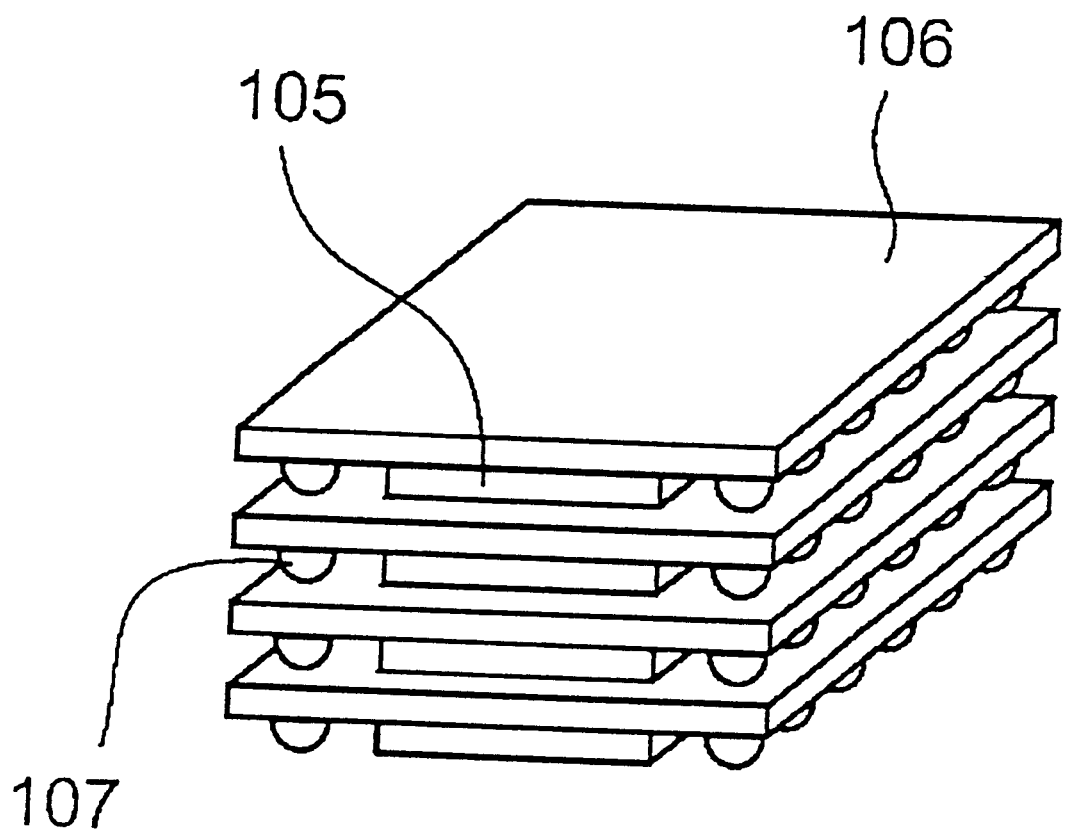
FIG. 2 is a schematic perspective view illustrative of a conventional stacked module of plural memory bear chips mounted on interposers stacked in multilevels.

The first present invention provides a semiconductor device comprising a plurality of semiconductor bear chips staked over a substrate, each of the semiconductor bear chips having top and bottom surfaces, each of the top and bottom surfaces of each of the semiconductor bear chips having both plural signal pads and plural chip select pads, wherein the plural chip select pads are aligned at a constant pitch in a first direction, and adjacent two of the plural semiconductor bear chips are displaced by a first distance corresponds to the constant pitch in the first direction.

It is possible that the plural chip select pads and the plural signal pads on the top surface of lower one of the adjacent two of the plural semiconductor bear chips are connected through electrically connective members to the plural chip select pads and the plural signal pads on the bottom surface of upper one of the adjacent two of the plural semiconductor bear chips, and wherein the electrically connective members in contact with the plural signal pads on the top surface of each of the plural semiconductor bear chips are displaced by the first distance in the first direction from the electrically connective members in contact with the plural signal pads on the bottom surface of the each of the plural semiconductor bear chips.

It is further possible that the electrically connective members comprise connective bumps.

It is also possible that the plural chip select pads and the plural signal pads on the top surface are common in pattern and layout among the plural semiconductor bear chips, whilst the plural chip select pads and the plural signal pads on the bottom surface are common in pattern and layout among the plural semiconductor bear chips.

It is further possible that the plural chip select pads and the plural signal pads are common in pattern and layout between the top and bottom surfaces of each of the plural semiconductor bear chips.

It is also possible that the plural chip select pads and the plural signal pads are different in pattern and layout between the top and bottom surfaces of each of the plural semiconductor bear chips.

It is also possible that, in each of the plural semiconductor bear chips, the plural chip select pads on the top surface and the plural chip select pads on the bottom surface are connected to each other through via contacts provided in the each of the plural semiconductor bear chips.

It is also possible that, in each of the plural semiconductor bear chips, the plural chip select pads on the top surface and the plural chip select pads on the bottom surface are connected to each other through interconnections provided on one side wall of the each of the plural semiconductor bear chips.

It is also possible that, in each of the plural semiconductor bear chips, the plural signal pads on a first center region of the top surface and the plural chip select pads on a second center region of on the bottom surface are connected to each other through via contacts provided in the each of the plural semiconductor bear chips.

It is also possible that, in each of the plural semiconductor bear chips, the plural chip select pads on a first side region of the top surface and the plural chip select pads on a second side region of the bottom surface are connected to each other through interconnections provided on one side wall of the each of the plural semiconductor bear chips, and the first and second side regions are adjacent to the one side wall.

It is also possible that, in each of the plural semiconductor bear chips, the plural chip select pads on the top surface and the plural chip select pads on the bottom surface are connected to each other through internal interconnections provided within the each of the plural semiconductor bear chips.

It is also possible that, in each of the plural semiconductor bear chips, the plural signal pads on a first center region of the top surface and the plural chip select pads on a second center region of on the bottom surface are connected to each other through internal interconnections provided within the each of the plural semiconductor bear chips.

It is also possible that the number of the plural chip select pads is not less than the number of the plural semiconductor bear chips.

It is also possible that each of the plural semiconductor bear chips is activated upon applying a chip select signal to first-end one of the plural chip select pads, and the first-end one is closest to a first side of the each of the plural semiconductor bear chips, and the first side extends vertical to the first direction and is positioned opposite to the first direction, so that the first-end one of the plural chip select pads is uncovered by upper one of the plural semiconductor bear chips, whilst remaining ones of the plural chip select pads are covered by the upper one of the plural semiconductor bear chips.

The second present invention provides a semiconductor device comprising a plurality of semiconductor bear chips staked over a substrate, each of the semiconductor bear chips having top and bottom surfaces, each of the top and bottom surfaces of each of the semiconductor bear chips having both plural signal pads and plural chip select pads, wherein the plural chip select pads and the plural signal pads on the top surface of lower one of the adjacent two of the plural semiconductor bear chips are connected through electrically connective members to the plural chip select pads and the plural signal pads on the bottom surface of upper one of the adjacent two of the plural semiconductor bear chips, and wherein the electrically connective members in contact with the plural signal pads on the top surface of each of the plural semiconductor bear chips are displaced by the first distance in the first direction from the electrically connective members in contacts with the plural signal pads on the bottom surface of the each of the plural semiconductor bear chips, wherein the plural chip select pads and the plural signal pads on the top surface are common in pattern and layout among the plural semiconductor bear chips, whilst the plural chip select pads and the plural signal pads on the bottom surface are common in pattern and layout among the plural semiconductor bear chips, and wherein the plural chip select pads are aligned at a constant pitch in a first direction, and adjacent two of the plural semiconductor bear chips are displaced by a first distance corresponds to the constant pitch in the first direction.

It is possible that the electrically connective members comprise connective bumps.

It is also possible that the plural chip select pads and the plural signal pads are common in pattern and layout between the top and bottom surfaces of each of the plural semiconductor bear chips.

It is also possible that the plural chip select pads and the plural signal pads are different in pattern and layout between the top and bottom surfaces of each of the plural semiconductor bear chips.

It is also possible that, in each of the plural semiconductor bear chips, the plural chip select pads on the top surface and the plural chip select pads on the bottom surface are connected to each other through via contacts provided in the each of the plural semiconductor bear chips.

It is also possible that, in each of the plural semiconductor bear chips, the plural chip select pads on the top surface and the plural chip select pads on the bottom surface are connected to each other through interconnections provided on one side wall of the each of the plural semiconductor bear chips.

It is also possible that, in each of the plural semiconductor bear chips, the plural signal pads on a first center region of the top surface and the plural chip select pads on a second center region of on the bottom surface are connected to each other through via contacts provided in the each of the plural semiconductor bear chips.

It is also possible that, in each of the plural semiconductor bear chips, the plural chip select pads on a first side region of the top surface and the plural chip select pads on a second side region of the bottom surface are connected to each other through interconnections provided on one side wall of the each of the plural semiconductor bear chips, and the first and second side regions are adjacent to the one side wall.

It is also possible that, in each of the plural semiconductor bear chips, the plural chip select pads on the top surface and the plural chip select pads on the bottom surface are connected to each other through internal interconnections provided within the each of the plural semiconductor bear chips.

It is also possible that, in each of the plural semiconductor bear chips, the plural signal pads on a first center region of the top surface and the plural chip select pads on a second center region of on the bottom surface are connected to each other through internal interconnections provided within the each of the plural semiconductor bear chips.

It is also possible that the number of the plural chip select pads is not less than the number of the plural semiconductor bear chips.

It is also possible that each of the plural semiconductor bear chips is activated upon applying a chip select signal to first-end one of the plural chip select pads, and the first-end one is closest to a first side of the each of the plural semiconductor bear chips, and the first side extends vertical to the first direction and is positioned opposite to the first direction, so that the first-end one of the plural chip select pads is uncovered by upper one of the plural semiconductor bear chips, whilst remaining ones of the plural chip select pads are covered by the upper one of the plural semiconductor bear chips.

PREFERRED EMBODIMENT

Figure 3:
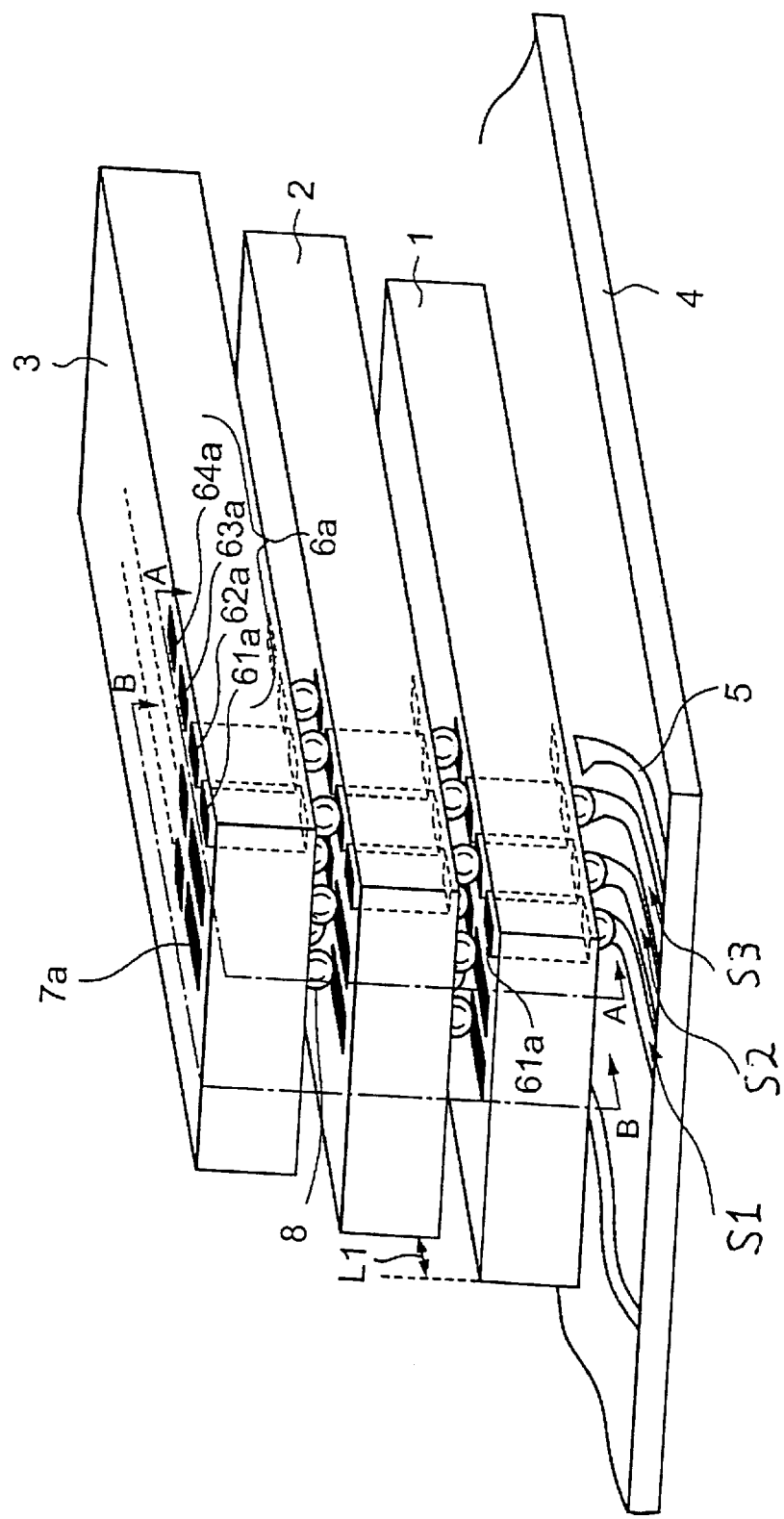
FIG. 3 is a schematic perspective view illustrative of a novel semiconductor device having an improved multilevel stacked semiconductor bear chip structure over a substrate in a preferred embodiment in accordance with the present invention.
Figure 4A:
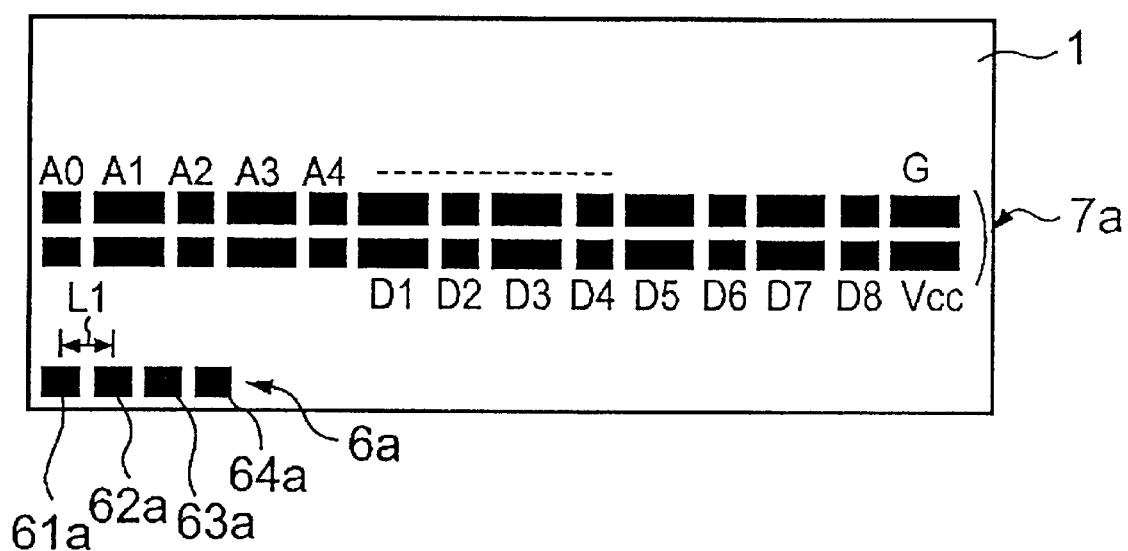
FIG. 4A is a plane view illustrative of a top surface of each of the stacked semiconductor bear chips in the form of the multilevel structure of the novel semiconductor device shown in FIG. 3.
Figure 4B:
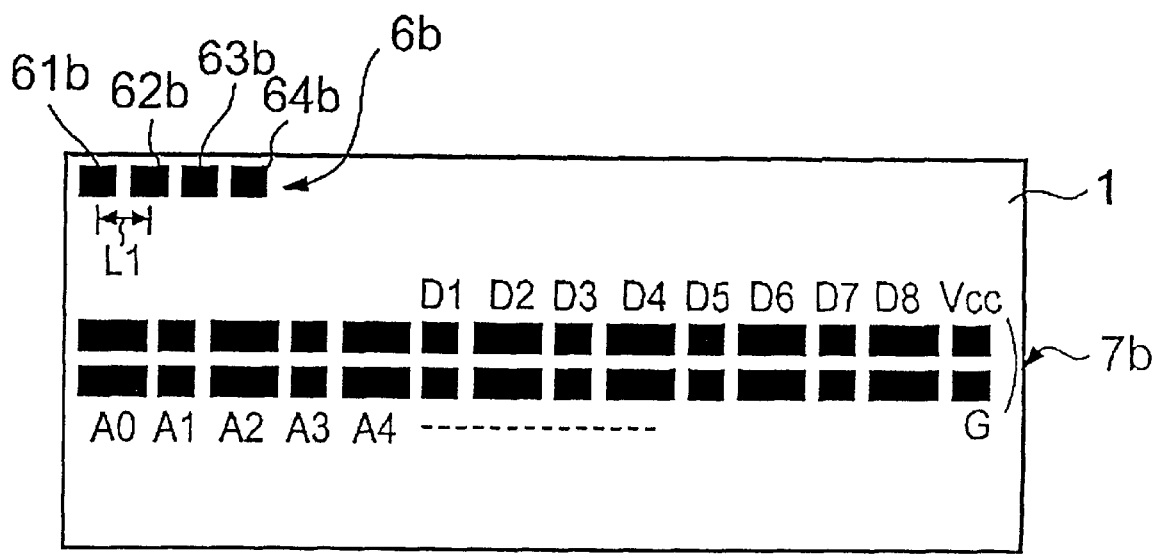
FIG. 4B is a plane view illustrative of a bottom surface of each of the stacked semiconductor bear chips in the form of the multilevel structure of the novel semiconductor device shown in FIG. 3.
Figure 5:
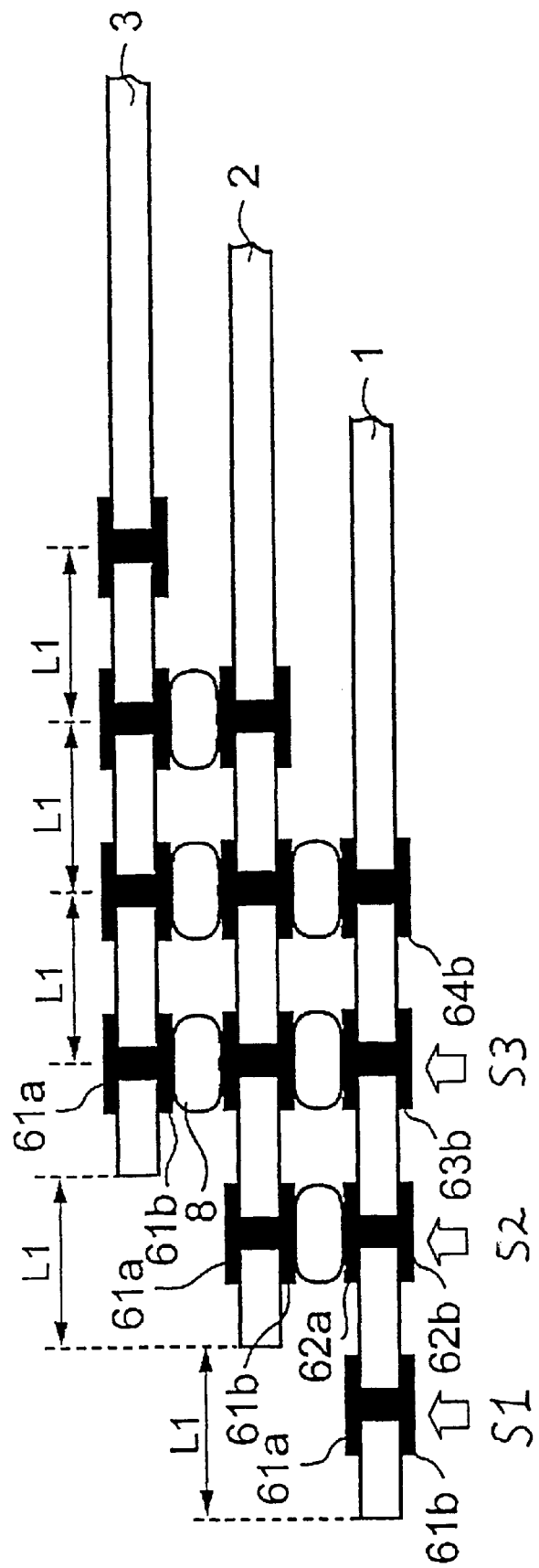
FIG. 5 is a fragmentary cross sectional elevation view illustrative of the improved multilevel structure of the stacked semiconductor bear chips of the novel semiconductor device, taken along an A—A line of FIG. 3.
Figure 6:
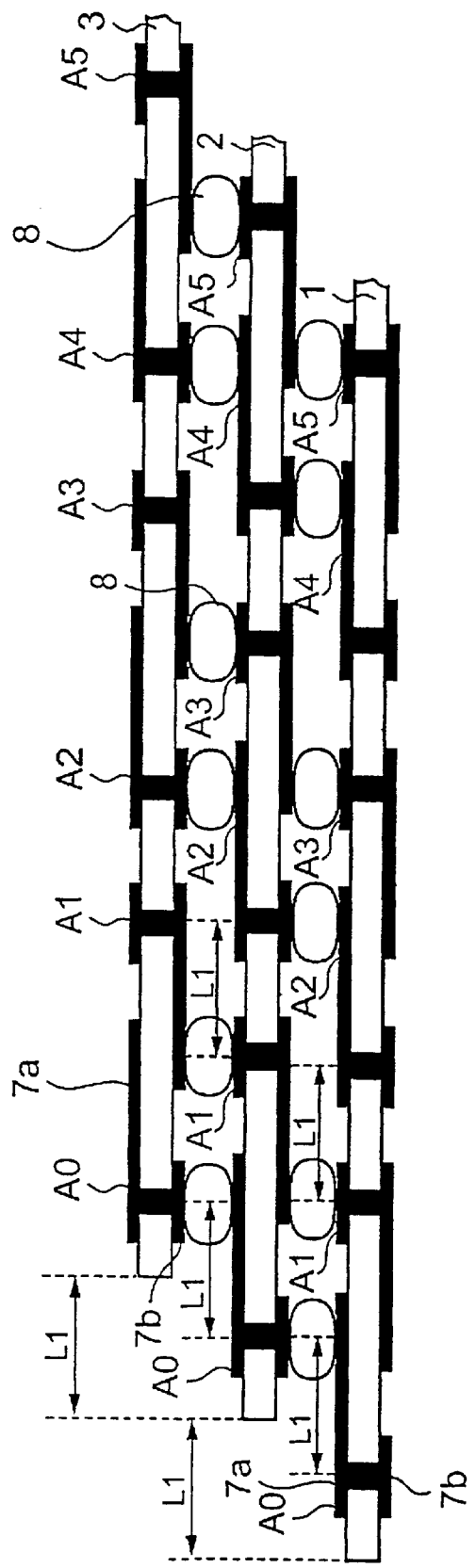
FIG. 6 is a fragmentary cross sectional elevation view illustrative of the improved multilevel structure of the stacked semiconductor bear chips of the novel semiconductor device, taken along a B—B line of FIG. 3.
Figure 7:
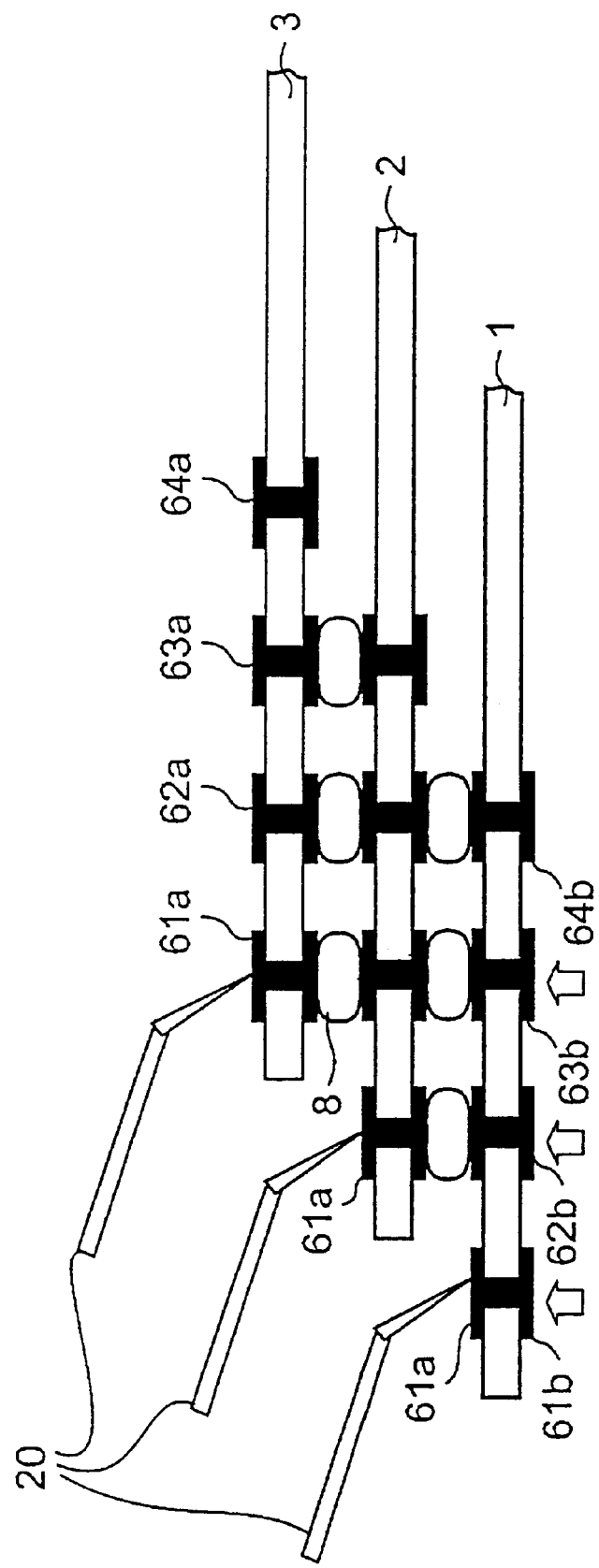
FIG. 7 is a fragmentary cross sectional elevation view illustrative of the improved multilevel structure of the stacked semiconductor bear chips of the novel semiconductor device, taken along an A—A line of FIG. 3 when test signals are applied through test probes to the first chip select pads of the stacked semiconductor bear chips.

A preferred embodiment according to the present invention will be described in detail with reference to the drawings. FIG. 3 is a schematic perspective view illustrative of a novel semiconductor device having an improved multilevel stacked semiconductor bear chip structure over a substrate in a preferred embodiment in accordance with the present invention. FIG. 4A is a plane view illustrative of a top surface of each of the stacked semiconductor bear chips in the form of the multilevel structure of the novel semiconductor device shown in FIG. 3. FIG. 4B is a plane view illustrative of a bottom surface of each of the stacked semiconductor bear chips in the form of the multilevel structure of the novel semiconductor device shown in FIG. 3. FIG. 5 is a fragmentary cross sectional elevation view illustrative of the improved multilevel structure of the stacked semiconductor bear chips of the novel semiconductor device, taken along an A—A line of FIG. 3. FIG. 6 is a fragmentary cross sectional elevation view illustrative of the improved multilevel structure of the stacked semiconductor bear chips of the novel semiconductor device, taken along a B—B line of FIG. 3. FIG. 7 is a fragmentary cross sectional elevation view illustrative of the improved multilevel structure of the stacked semiconductor bear chips of the novel semiconductor device, taken along an A—A line of FIG. 3 when test signals are applied through test probes to the first chip select pads of the stacked semiconductor bear chips.

The improved multilevel structure of the novel semiconductor device comprises three stacked semiconductor bear chips 1, 2 and 3 over a substrate 4. Namely, a first level semiconductor bear chip 1 is provided over the substrate 4. A second level semiconductor bear chip 2 is also provided over the first level semiconductor bear chip 1. A third level semiconductor bear chip 3 is also provided over the second level semiconductor bear chip 2. Each of the first level, second level and third level semiconductor bear chips 1, 2 and 3 may comprise a memory bear chip such as DRAM. The first level, second level and third level semiconductor bear chips 1, 2 and 3 are the same in size, external electrode patterns and interconnection patterns. The interconnection patterns include internal interconnections extending from the external electrodes and semiconductor circuit patterns. The first level, second level and third level semiconductor bear chips 1, 2 and 3 are stacked over the substrate 4 so that the first level, second level and third level semiconductor bear chips 1, 2 and 3 are not aligned and displaced in a direction parallel to a longitudinal direction of the first level, second level and third level semiconductor bear chips 1, 2 and 3. The one side edge of the second level semiconductor bear chip 2 is displaced by a distance "L1" from the one side edge of the first level semiconductor bear chip 1. Further, the one side edge of the third level semiconductor bear chip 3 is displaced by the distance "L1" from the one side edge of the second level semiconductor bear chip 2.

Plural interconnections 5 extend over the top surface of the substrate 4. The interconnections 5 comprise a first interconnection for transmitting a first level semiconductor bear chip selecting signal S1 to select the first level semiconductor bear chip 1, a second interconnection for transmitting a second level semiconductor bear chip selecting signal S2 to select the second level semiconductor bear chip 2, a third interconnection for transmitting a third level semiconductor bear chip selecting signal S3 to select the third level semiconductor bear chip 3, and other interconnections for transmitting address signals and data signals to the first level, second level and third level semiconductor bear chips 1, 2 and 3.

The first level semiconductor bear chip 1 has a bottom surface which has a first level bottom surface array of plural signal pads 7b and a first level bottom surface single alignment of four chip select pads 6b. The bottom surface of the first level semiconductor bear chip 1 has a first level array of connective bumps 8 which are in contact with the first level bottom surface array of the plural signal pads 7b and the first level bottom surface single alignment of the four chip select pads 6b and also in contact with the interconnections 5 extending over the top surface of the substrate 4, so that the first level bottom surface array of the plural signal pads 7b and the first level bottom surface single alignment of the four chip select pads 6b are electrically connected through the connective bumps 8 to the interconnections 5 extending over the top surface of the substrate 4. The connective bumps 8 may comprise metal bumps such as solder bumps and gold bumps. The first level semiconductor bear chip 1 has a top surface which has a first level top surface array of plural signal pads 7a and a first level top surface single alignment of four chip select pads 6a.

The second level semiconductor bear chip 2 has a bottom surface which has a second level bottom surface array of plural signal pads 7b and a second level bottom surface single alignment of four chip select pads 6b. The bottom surface of the second level semiconductor bear chip 2 has a second level array of connective bumps 8 which are in contact with the second level bottom surface array of the plural signal pads 7b and the second level bottom surface single alignment of the four chip select pads 6b and also in contact with the first level top surface array of plural signal pads 7a and the first level top surface single alignment of four chip select pads 6a of the first level semiconductor bear chip 1, so that the second level bottom surface array of the plural signal pads 7b and the second level bottom surface single alignment of the four chip select pads 6b are electrically connected through the second level array of the connective bumps 8 to the first level top surface array of plural signal pads 7a and the first level top surface single alignment of four chip select pads 6a of the first level semiconductor bear chip 1. The connective bumps 8 may comprise metal bumps such as solder bumps and gold bumps. The second level semiconductor bear chip 2 has a top surface which has a second level top surface array of plural signal pads 7a and a second level top surface single alignment of four chip select pads 6a.

The third level semiconductor bear chip 3 has a bottom surface which has a third level bottom surface array of plural signal pads 7b and a third level bottom surface single alignment of four chip select pads 6b. The bottom surface of the third level semiconductor bear chip 3 has a third level array of connective bumps 8 which are in contact with the third level bottom surface array of the plural signal pads 7b and the third level bottom surface single alignment of the four chip select pads 6b and also in contact with the second level top surface array of plural signal pads 7a and the second level top surface single alignment of four chip select pads 6a of the second level semiconductor bear chip 2, so that the third level bottom surface array of the plural signal pads 7b and the third level bottom surface single alignment of the four chip select pads 6b are electrically connected through the third level array of the connective bumps 8 to the second level top surface array of plural signal pads 7a and the second level top surface single alignment of four chip select pads 6a of the second level semiconductor bear chip 2. The connective bumps 8 may comprise metal bumps such as solder bumps and gold bumps. The third level semiconductor bear chip 3 has a top surface which has a third level top surface array of plural signal pads 7a and a third level top surface single alignment of four chip select pads 6a.

As shown in FIG. 4A illustrative of the top surface of each of the first level, second level and third level semiconductor bear chips 1, 2 and 3, each of the first level, second level and third level top surface arrays of the plural signal pads 7a comprises dual alignments of the signal pads 7a. Each of the first level, second level and third level top surface single alignments of the four chip select pads 6a comprises a single alignment of the four chip select pads 6a. The dual alignments of the signal pads 7a further comprise plural address signal electrode pads A0, A1, A2, A3, A4 - - - , data signal electrode pads D1, D2, D3, D4, D5, D6, D7 and D8, a power electrode pad Vcc and a ground pad G as well as other electrode pads. The single alignment of the four chip select pads 6a further comprises a first chip select pad 61a, a second chip select pad 62a, a third chip select pad 63a, and a fourth chip select pad 64a which are aligned at a constant pitch "L1".

If the first chip select pad 61a receives the chip select signal, then the semiconductor bear chip is selected and activated. If the second chip select pad 62a receives the chip select signal, then the semiconductor bear chip is unselected and inactivated. If the third chip select pad 63a receives the chip select signal, then the semiconductor bear chip is unselected and inactivated. If the fourth chip select pad 64a receives the chip select signal, then the semiconductor bear chip is unselected and inactivated. Only when the chip select signal enters into the first chip select pad 61a, then the semiconductor bear chip is selected and activated.

As shown in FIG. 4B illustrative of the bottom surface of each of the first level, second level and third level semiconductor bear chips 1, 2 and 3, each of the first level, second level and third level bottom surface arrays of the plural signal pads 7b comprises dual alignments of the signal pads 7b. Each of the first level, second level and third level bottom surface single alignments of the four chip select pads 6b comprises a single alignment of the four chip select pads 6b. The dual alignments of the signal pads 7b further comprise plural address signal electrode pads A0, A1, A2, A3, A4 - - - , data signal electrode pads D1, D2, D3, D4, D5, D6, D7 and D8, a power electrode pad Vcc and a ground pad G as well as other electrode pads. The single alignment of the four chip select pads 6b further comprises a first chip select pad 61b, a second chip select pad 62b, a third chip select pad 63b, and a fourth chip select pad 64b which are aligned at a constant pitch "L1".

If the first chip select pad 61b receives the chip select signal, then the semiconductor bear chip is selected and activated. If the second chip select pad 62b receives the chip select signal, then the semiconductor bear chip is unselected and inactivated. If the third chip select pad 63b receives the chip select signal, then the semiconductor bear chip is unselected and inactivated. If the fourth chip select pad 64b receives the chip select signal, then the semiconductor bear chip is unselected and inactivated. Only when the chip select signal enters into the first chip select pad 61b, then the semiconductor bear chip is selected and activated.

As described above, the first level, second level and third level semiconductor bear chips 1, 2 and 3 are stacked over the substrate 4 so that the first level, second level and third level semiconductor bear chips 1, 2 and 3 are not aligned and displaced in a direction parallel to a longitudinal direction of the first level, second level and third level semiconductor bear chips 1, 2 and 3. The one side edge of the second level semiconductor bear chip 2 is displaced by a distance "L1"

from the one side edge of the first level semiconductor bear chip 1. Further, the one side edge of the third level semiconductor bear chip 3 is displaced by the distance "L1" from the one side edge of the second level semiconductor bear chip 2.

The bottom surface shown in FIG. 4B of the second level semiconductor bear chip 2 faces to the top surface shown in FIG. 4A of the first level semiconductor bear chip 1. Also the bottom surface shown in FIG. 4B of the third level semiconductor bear chip 3 faces to the top surface shown in FIG. 4A of the second level semiconductor bear chip 2. Namely, the bottom surface shown in FIG. 4B of the second level semiconductor bear chip 2 is laminated with a displacement of the distance "L1" over the top surface shown in FIG. 4A of the first level semiconductor bear chip 1. Also the bottom surface shown in FIG. 4B of the third level semiconductor bear chip 3 is laminated with a displacement of the distance "L1" over the top surface shown in FIG. 4A of the second level semiconductor bear chip 2. Consequently, the bottom surface shown in FIG. 4B is laminated with a displacement of the distance "L1" over the top surface shown in FIG. 4A. It is necessary that when the bottom surface shown in FIG. 4B is laminated with a displacement of the distance "L1" over the top surface shown in FIG. 4A, then individual positions of the signal pads 7a and the chip select pads 6a shown in FIG. 4A correspond to the individual positions of the signal pads 7b and the chip select pads 6b shown in FIG. 4B. For those reasons, the address signal electrode pads A0 on the bottom surface shown in FIG. 4B are identical in pattern with the address signal electrode pads A1 on the top surface shown in FIG. 4A, and the address signal electrode pads A0 on the bottom surface shown in FIG. 4B are connected through the connective bumps 8 to the address signal electrode pads A1 on the top surface shown in FIG. 4A. The address signal electrode pads A1 on the bottom surface shown in FIG. 4B are identical in pattern with the address signal electrode pads A2 on the top surface shown in FIG. 4A, and the address signal electrode pads A1 on the bottom surface shown in FIG. 413 are connected through the connective bumps 8 to the address signal electrode pads A2 on the top surface shown in FIG. 4A. The address signal electrode pads A2 on the bottom surface shown in FIG. 4B are identical in pattern with the address signal electrode pads A3 on the top surface shown in FIG. 4A, and the address signal electrode pads A2 on the bottom surface shown in FIG. 4B are connected through the connective bumps 8 to the address signal electrode pads A3 on the top surface shown in FIG. 4A. The address signal electrode pads A3 on the bottom surface shown in FIG. 4B are identical in pattern with the address signal electrode pads A4 on the top surface shown in FIG. 4A, and the address signal electrode pads A3 on the bottom surface shown in FIG. 4B are connected through the connective bumps 8 to the address signal electrode pads A4 on the top surface shown in FIG. 4A. The address signal electrode pads A4 on the bottom surface shown in FIG. 4B are identical in pattern with the data signal electrode pads D1 on the top surface shown in FIG. 4A, and the address signal electrode pads A4 on the bottom surface shown in FIG. 4B are connected through the connective bumps 8 to the data signal electrode pads D1 on the top surface shown in FIG. 4A. The data signal electrode pads D1 on the bottom surface shown in FIG. 4B are identical in pattern with the data signal electrode pads D2 on the top surface shown in FIG. 4A, and the data signal electrode pads D1 on the bottom surface shown in FIG. 4B are connected through the connective bumps 8 to the data signal electrode pads D2 on the top surface shown in FIG. 4A. The data signal electrode pads D2 on the bottom surface shown in FIG. 4B are identical in pattern with the data signal electrode pads D3 on the top surface shown in FIG. 4A, and the data signal electrode pads D2 on the bottom surface shown in FIG. 4B are connected through the connective bumps 8 to the data signal electrode pads D3 on the top surface shown in FIG. 4A. The data signal electrode pads D3 on the bottom surface shown in FIG. 4B are identical in pattern with the data signal electrode pads D4 on the top surface shown in FIG. 4A, and the data signal electrode pads D3 on the bottom surface shown in FIG. 4B are connected through the connective bumps 8 to the data signal electrode pads D4 on the top surface shown in FIG. 4A. The data signal electrode pads D4 on the bottom surface shown in FIG. 4B are identical in pattern with the data signal electrode pads D5 on the top surface shown in FIG. 4A, and the data signal electrode pads D4 on the bottom surface shown in FIG. 4B are connected through the connective bumps 8 to the data signal electrode pads D5 on the top surface shown in FIG. 4A. The data signal electrode pads D5 on the bottom surface shown in FIG. 4B are identical in pattern with the data signal electrode pads D6 on the top surface shown in FIG. 4A, and the data signal electrode pads D5 on the bottom surface shown in FIG. 4B are connected through the connective bumps 8 to the data signal electrode pads D6 on the top surface shown in FIG. 4A. The data signal electrode pads D6 on the bottom surface shown in FIG. 4B are identical in pattern with the data signal electrode pads D7 on the top surface shown in FIG. 4A, and the data signal electrode pads D6 on the bottom surface shown in FIG. 4B are connected through the connective bumps 8 to the data signal electrode pads D7 on the top surface shown in FIG. 4A. The data signal electrode pads D7 on the bottom surface shown in FIG. 4B are identical in pattern with the data signal electrode pads D8 on the top surface shown in FIG. 4A, and the data signal electrode pads D7 on the bottom surface shown in FIG. 4B are connected through the connective bumps 8 to the data signal electrode pads D8 on the top surface shown in FIG. 4A. The data signal electrode pads D8 on the bottom surface shown in FIG. 4B are identical in pattern with the power electrode pad Vcc and the ground electrode pad G on the top surface shown in FIG. 4A, and the data signal electrode pads D8 on the bottom surface shown in FIG. 4B are connected through the connective bumps 8 to the power electrode pad Vcc and the ground electrode pad G on the top surface shown in FIG. 4A. The first chip select pad 61b on the bottom surface shown in FIG. 4B is identical in pattern with the second chip select pad 62a on the top surface shown in FIG. 4A, and the first chip select pad 61b on the bottom surface shown in FIG. 4B is connected through the connective bump 8 to the second chip select pad 62a on the top surface shown in FIG. 4A. The second chip select pad 62b on the bottom surface shown in FIG. 4B is identical in pattern with the third chip select pad 63a on the top surface shown in FIG. 4A, and the second chip select pad 62b on the bottom surface shown in FIG. 4B is connected through the connective bump 8 to the third chip select pad 63a on the top surface shown in FIG. 4A. The third chip select pad 63b on the bottom surface shown in FIG. 4B is identical in pattern with the fourth chip select pad 64a on the top surface shown in FIG. 4A, and the third chip select pad 63b on the bottom surface shown in FIG. 4B is connected through the connective bump 8 to the fourth chip select pad 64a on the top surface shown in FIG. 4A.

The above described relationships between the top surface shown in FIG. 4A and the bottom surface shown in FIG. 4B are common to the relationships between the first level and second level semiconductor bear chips 1 and 2 and also between the second level and third level semiconductor bear chips 2 and 3.

As shown in FIG. 5, the first chip select pad 61*b* on the bottom surface of the first level semiconductor bear chip 1 is connected to the first chip select pad 61*a* on the top surface of the first level semiconductor bear chip 1. The first level semiconductor bear chip selecting signal S1 is applied to the first chip select pad 61*b* on the bottom surface of the first level semiconductor bear chip 1 and then transmitted to the first chip select pad 61*a* on the top surface of the first level semiconductor bear chip 1. Since the first chip select pad 61*a* on the top surface of the first level semiconductor bear chip 1 receives the first level semiconductor bear chip selecting signal S1, then the first level semiconductor bear chip 1 is activated.

The second chip select pad 62*b* on the bottom surface of the first level semiconductor bear chip 1 is connected to the second chip select pad 62*a* on the top surface of the first level semiconductor bear chip 1. The second chip select pad 62*a* on the top surface of the first level semiconductor bear chip 1 is further connected through the connective bump 8 to the first chip select pad 61*b* on the bottom surface of the second level semiconductor bear chip 2. The first chip select pad 61*b* on the bottom surface of the second level semiconductor bear chip 2 is further connected to the first chip select pad 61*a* on the top surface of the second level semiconductor bear chip 2. The second level semiconductor bear chip selecting signal S2 is applied to the second chip select pad 62*b* on the bottom surface of the first level semiconductor bear chip 1 and then transmitted to the second chip select pad 62*a* on the top surface of the first level semiconductor bear chip 1. Since the second chip select pad 62*a* on the top surface of the first level semiconductor bear chip 1 receives the second level semiconductor bear chip selecting signal S2, then the first level semiconductor bear chip 1 is inactivated. However, the second level semiconductor bear chip selecting signal S2 is further transmitted through the connective bump 8 to the first chip select pad 61*b* on the bottom surface of the second level semiconductor bear chip 2 and then transmitted to the first chip select pad 61*a* on the top surface of the second level semiconductor bear chip 1. Since the first chip select pad 61*a* on the top surface of the second level semiconductor bear chip 2 receives the second level semiconductor bear chip selecting signal S2, then the first level semiconductor bear chip 2 is activated.

The third chip select pad 63*b* on the bottom surface of the first level semiconductor bear chip 1 is connected to the third chip select pad 63*a* on the top surface of the first level semiconductor bear chip 1. The third chip select pad 63*a* on the top surface of the first level semiconductor bear chip 1 is further connected through the connective bump 8 to the second chip select pad 62*b* on the bottom surface of the second level semiconductor bear chip 2. The second chip select pad 62*b* on the bottom surface of the second level semiconductor bear chip 2 is further connected to the second chip select pad 62*a* on the top surface of the second level semiconductor bear chip 2. The second chip select pad 62*a* on the top surface of the second level semiconductor bear chip 2 is further connected through the connective bump 8 to the first chip select pad 61*b* on the bottom surface of the third level semiconductor bear chip 3. The first chip select pad 61*b* on the bottom surface of the third level semiconductor bear chip 3 is further connected to the first chip select pad 61*a* on the top surface of the third level semiconductor bear chip 3. The third level semiconductor bear chip selecting signal S3 is applied to the third chip select pad 63*b* on the bottom surface of the first level semiconductor bear chip 1 and then transmitted to the third chip select pad 63*a* on the top surface of the first level semiconductor bear chip 1. Since the third chip select pad 63*a* on the top surface of the first level semiconductor bear chip 1 receives the third level semiconductor bear chip selecting signal S3, then the first level semiconductor bear chip 1 is inactivated. The third level semiconductor bear chip selecting signal S3 is further transmitted through the connective bump 8 to the second chip select pad 62*b* on the bottom surface of the second level semiconductor bear chip 2 and then transmitted to the second chip select pad 62*a* on the top surface of the second level semiconductor bear chip 2. Since the second chip select pad 62*a* on the top surface of the second level semiconductor bear chip 2 receives the third level semiconductor bear chip selecting signal S3, then the second level semiconductor bear chip 2 is inactivated. However, the third level semiconductor bear chip selecting signal S3 is further more transmitted through the connective bump 8 to the first chip select pad 61*b* on the bottom surface of the third level semiconductor bear chip 3 and then transmitted to the first chip select pad 61*a* on the top surface of the third level semiconductor bear chip 3. Since the first chip select pad 61*a* on the top surface of the third level semiconductor bear chip 3 receives the third level semiconductor bear chip selecting signal S3, then the third level semiconductor bear chip 3 is activated.

As described above, the first level, second level and third level semiconductor bear chips 1, 2 and 3 are laminated to make the displacement "L" between them.

As shown in FIG. 6, the address signal electrode pads may be formed. The address signal electrode pads may be classified into two types in the pattern. The first type pattern is short and the second type pattern is long. The first type pattern is shorter than the second type by the distance "L" corresponding to the displacement between the adjacent two of the first level, second level and third level semiconductor bear chips 1, 2 and 3. The address signal electrode pad A0 on the bottom surface of the first level semiconductor bear chip 1 is of the first type pattern which is shorter pattern. The address signal electrode pad A0 on the top surface of the first level semiconductor bear chip 1 is of the second type pattern which is longer pattern. The first side edge of the address signal electrode pad A0 on the top surface of the first level semiconductor bear chip 1 is just aligned to the first side edge of the address signal electrode pad A0 on the bottom surface of the first level semiconductor bear chip 1. The second side edge of the address signal electrode pad A0 on the top surface of the first level semiconductor bear chip 1 extends by the distance "L" from the second side edge of the address signal electrode pad A0 on the bottom surface of the first level semiconductor bear chip 1. The address signal electrode pad A0 on the top surface of the first level semiconductor bear chip 1 is connected through the through hole to the address signal electrode pad A0 on the bottom surface of the first level semiconductor bear chip 1. The connective bump 8 is provided on the address signal electrode pad A0 on the top surface of the first level semiconductor bear chip 1 at a position displaced by "L" from the through hole. The address signal electrode pad A0 on the bottom surface of the second level semiconductor bear chip 2 is connected through the connective bump 8 to the address signal electrode pad A0 on the top surface of the first level semiconductor bear chip 1. The address signal electrode pad A0 on the bottom surface of the second level semiconductor bear chip 2 is of the first type pattern which is shorter pattern and also is the same pattern as the address signal electrode pad A0 on the bottom surface of the first level semiconductor bear chip 1. The address signal electrode pad A0 on the top surface of the second level semiconductor bear chip 2 is of the second type pattern which is longer pattern and also the same pattern as the address signal electrode pad A0 on the top surface of the first level semiconductor bear chip 1. The first side edge of the address signal electrode pad A0 on the top surface of the second level semiconductor bear chip 2 is just aligned to the first side edge of the address signal electrode pad A0 on the bottom surface of the second level semiconductor bear chip 2. The second side edge of the address signal electrode pad A0 on the top surface of the second level semiconductor bear chip 2 extends by the distance "L" from the second side edge of the address signal electrode pad A0 on the bottom surface of the second level semiconductor bear chip 2. The address signal electrode pad A0 on the top surface of the second level semiconductor bear chip 2 is connected through the through hole to the address signal electrode pad A0 on the bottom surface of the second level semiconductor bear chip 2. The connective bump 8 is provided on the address signal electrode pad A0 on the top surface of the second level semiconductor bear chip 2 at a position displaced by "L" from the through hole. The address signal electrode pad A0 on the bottom surface of the third level semiconductor bear chip 3 is connected through the connective bump 8 to the address signal electrode pad A0 on the top surface of the second level semiconductor bear chip 2. The address signal electrode pad A0 on the bottom surface of the third level semiconductor bear chip 3 is of the first type pattern which is shorter pattern and also is the same pattern as the address signal electrode pad A0 on the bottom surface of the first level and second level semiconductor bear chips 1 and 2. The address signal electrode pad A0 on the top surface of the third level semiconductor bear chip 3 is of the second type pattern which is longer pattern and also the same pattern as the address signal electrode pad A0 on the top surface of the first level and second level semiconductor bear chips 1 and 2. The first side edge of the address signal electrode pad A0 on the top surface of the third level semiconductor bear chip 3 is just aligned to the first side edge of the address signal electrode pad A0 on the bottom surface of the third level semiconductor bear chip 3. The second side edge of the address signal electrode pad A0 on the top surface of the third level semiconductor bear chip 3 extends by the distance "L" from the second side edge of the address signal electrode pad A0 on the bottom surface of the third level semiconductor bear chip 3. The address signal electrode pad A0 on the top surface of the third level semiconductor bear chip 3 is connected through the through hole to the address signal electrode pad A0 on the bottom surface of the third level semiconductor bear chip 3.

The address signal electrode pad A1 on the bottom surface of the first level semiconductor bear chip 1 is of the second type pattern which is longer pattern. The address signal electrode pad A1 on the top surface of the first level semiconductor bear chip 1 is of the first type pattern which is shorter pattern. The second side edge of the address signal electrode pad A1 on the top surface of the first level semiconductor bear chip 1 is just aligned to the second side edge of the address signal electrode pad A1 on the bottom surface of the first level semiconductor bear chip 1. The first side edge of the address signal electrode pad A1 on the top surface of the first level semiconductor bear chip 1 extends by the distance "L" from the first side edge of the address signal electrode pad A1 on the bottom surface of the first level semiconductor bear chip 1. The address signal electrode pad A1 on the top surface of the first level semiconductor bear chip 1 is connected through the through hole to the address signal electrode pad A1 on the bottom surface of the first level semiconductor bear chip 1. The connective bump 8 is provided on the address signal electrode pad A1 on the top surface of the first level semiconductor bear chip 1 at a position displaced by "L" from the through hole. The address signal electrode pad A1 on the bottom surface of the second level semiconductor bear chip 2 is connected through the connective bump 8 to the address signal electrode pad A1 on the top surface of the first level semiconductor bear chip 1. The address signal electrode pad A1 on the bottom surface of the second level semiconductor bear chip 2 is of the second type pattern which is longer pattern and also is the same pattern as the address signal electrode pad A1 on the bottom surface of the first level semiconductor bear chip 1. The address signal electrode pad A1 on the top surface of the second level semiconductor bear chip 2 is of the first type pattern which is shorter pattern and also the same pattern as the address signal electrode pad A1 on the top surface of the first level semiconductor bear chip 1. The second side edge of the address signal electrode pad A1 on the top surface of the second level semiconductor bear chip 2 is just aligned to the second side edge of the address signal electrode pad A1 on the bottom surface of the second level semiconductor bear chip 2. The first side edge of the address signal electrode pad A1 on the top surface of the second level semiconductor bear chip 2 extends by the distance "L" from the first side edge of the address signal electrode pad A1 on the bottom surface of the second level semiconductor bear chip 2. The address signal electrode pad A1 on the top surface of the second level semiconductor bear chip 2 is connected through the through hole to the address signal electrode pad A1 on the bottom surface of the second level semiconductor bear chip 2. The connective bump 8 is provided on the address signal electrode pad A1 on the top surface of the second level semiconductor bear chip 2 at a position displaced by "L" from the through hole. The address signal electrode pad A1 on the bottom surface of the third level semiconductor bear chip 3 is connected through the connective bump 8 to the address signal electrode pad A1 on the top surface of the second level semiconductor bear chip 2. The address signal electrode pad A1 on the bottom surface of the third level semiconductor bear chip 3 is of the second type pattern which is longer pattern and also is the same pattern as the address signal electrode pad A1 on the bottom surface of the first level and second level semiconductor bear chips 1 and 2. The address signal electrode pad A1 on the top surface of the third level semiconductor bear chip 3 is of the first type pattern which is shorter pattern and also the same pattern as the address signal electrode pad A1 on the top surface of the first level and second level semiconductor bear chips 1 and 2. The second side edge of the address signal electrode pad A1 on the top surface of the third level semiconductor bear chip 3 is just aligned to the second side edge of the address signal electrode pad A1 on the bottom surface of the third level semiconductor bear chip 3. The first side edge of the address signal electrode pad A1 on the top surface of the third level semiconductor bear chip 3 extends by the distance "L" from the first side edge of the address signal electrode pad A1 on the bottom surface of the third level semiconductor bear chip 3. The address signal electrode pad A1 on the top, surface of the third level semiconductor bear chip 3 is connected through the through hole to the address signal electrode pad A1 on the bottom surface of the third level semiconductor bear chip 3. The first type pattern is short and the second type pattern is long. The first type pattern is shorter than the second type by the distance "L" corresponding to the displacement between the adjacent two of the first level, second level and third level semiconductor bear chips 1, 2 and 3. The address signal electrode pad A2 on the bottom surface of the first level semiconductor bear chip 1 is of the first type pattern which is shorter pattern. The address signal electrode pad A2 on the top surface of the first level semiconductor bear chip 1 is of the second type pattern which is longer pattern. The first side edge of the address signal electrode pad A2 on the top surface of the first level semiconductor bear chip 1 is just aligned to the first side edge of the address signal electrode pad A2 on the bottom surface of the first level semiconductor bear chip 1. The second side edge of the address signal electrode pad A2 on the top surface of the first level semiconductor bear chip 1 extends by the distance "L" from the second side edge of the address signal electrode pad A2 on the bottom surface of the first level semiconductor bear chip 1. The address signal electrode pad A2 on the top surface of the first level semiconductor bear chip 1 is connected through the through hole to the address signal electrode pad A2 on the bottom surface of the first level semiconductor bear chip 1. The connective bump 8 is provided on the address signal electrode pad A2 on the top surface of the first level semiconductor bear chip 1 at a position displaced by "L" from the through hole. The address signal electrode pad A2 on the bottom surface of the second level semiconductor bear chip 2 is connected through the connective bump 8 to the address signal electrode pad A2 on the top surface of the first level semiconductor bear chip 1. The address signal electrode pad A2 on the bottom surface of the second level semiconductor bear chip 2 is of the first type pattern which is shorter pattern and also is the same pattern as the address signal electrode pad A2 on the bottom surface of the first level semiconductor bear chip 1. The address signal electrode pad A2 on the top surface of the second level semiconductor bear chip 2 is of the second type pattern which is longer pattern and also the same pattern as the address signal electrode pad A2 on the top surface of the first level semiconductor bear chip 1. The first side edge of the address signal electrode pad A2 on the top surface of the second level semiconductor bear chip 2 is just aligned to the first side edge of the address signal electrode pad A2 on the bottom surface of the second level semiconductor bear chip 2. The second side edge of the address signal electrode pad A2 on the top surface of the second level semiconductor bear chip 2 extends by the distance "L" from the second side edge of the address signal electrode pad A2 on the bottom surface of the second level semiconductor bear chip 2. The address signal electrode pad A2 on the top surface of the second level semiconductor bear chip 2 is connected through the through hole to the address signal electrode pad A2 on the bottom surface of the second level semiconductor bear chip 2. The connective bump 8 is provided on the address signal electrode pad A2 on the top surface of the second level semiconductor bear chip 2 at a position displaced by "L" from the through hole. The address signal electrode pad A2 on the bottom surface of the third level semiconductor bear chip 3 is connected through the connective bump 8 to the address signal electrode pad A2 on the top surface of the second level semiconductor bear chip 2. The address signal electrode pad A2 on the bottom surface of the third level semiconductor bear chip 3 is of the first type pattern which is shorter pattern and also is the same pattern as the address signal electrode pad A2 on the bottom surface of the first level and second level semiconductor bear chips 1 and 2. The address signal electrode pad A2 on the top surface of the third level semiconductor bear chip 3 is of the second type pattern which is longer pattern and also the same pattern as the address signal electrode pad A2 on the top surface of the first level and second level semiconductor bear chips 1 and 2. The First side edge of the address signal electrode pad A2 on the top surface of the third level semiconductor bear chip 3 is just aligned to the first side edge of the address signal electrode pad A2 on the bottom surface of the third level semiconductor bear chip 3. The second side edge of the address signal electrode pad A2 on the top surface of the third level semiconductor bear chip 3 extends by the distance "L" from the second side edge of the address signal electrode pad A2 on the bottom surface of the third level semiconductor bear chip 3. The address signal electrode pad A2 on the top surface of the third level semiconductor bear chip 3 is connected through the through hole to the address signal electrode pad A2 on the bottom surface of the third level semiconductor bear chip 3.

The address signal electrode pad A3 on the bottom surface of the first level semiconductor bear chip 1 is of the second type pattern which is longer pattern. The address signal electrode pad A3 on the top surface of the first level semiconductor bear chip 1 is of the first type pattern which is shorter pattern. The second side edge of the address signal electrode pad A3 on the top surface of the first level semiconductor bear chip 1 is just aligned to the second side edge of the address signal electrode pad A3 on the bottom surface of the first level semiconductor bear chip 1. The first side edge of the address signal electrode pad A3 on the top surface of the first level semiconductor bear chip 1 extends by the distance "L" from the first side edge of the address signal electrode pad A3 on the bottom surface of the first level semiconductor bear chip 1. The address signal electrode pad A3 on the top surface of the first level semiconductor bear chip 1 is connected through the through hole to the address signal electrode pad A3 on the bottom surface of the first level semiconductor bear chip 1. The connective bump 8 is provided on the address signal electrode pad A3 on the top surface of the first level semiconductor bear chip 1 at a position displaced by "L" from the through hole. The address signal electrode pad A3 on the bottom surface of the second level semiconductor bear chip 2 is connected through the connective bump 8 to the address signal electrode pad A3 on the top surface of the first level semiconductor bear chip 1. The address signal electrode pad A3 on the bottom surface of the second level semiconductor bear chip 2 is of the second type pattern which is longer pattern and also is the same pattern as the address signal electrode pad A3 on the bottom surface of the first level semiconductor bear chip 1. The address signal electrode pad A3 on the top surface of the second level semiconductor bear chip 2 is of the first type pattern which is shorter pattern and also the same pattern as the address signal electrode pad A3 on the top surface of the first level semiconductor bear chip 1. The second side edge of the address signal electrode pad A3 on the top surface of the second level semiconductor bear chip 2 is just aligned to the second side edge of the address signal electrode pad A3 on the bottom surface of the second level semiconductor bear chip 2. The first side edge of the address signal electrode pad A3 on the top surface of the second level semiconductor bear chip 2 extends by the distance "L" from the first side edge of the address signal electrode pad A3 on the bottom surface of the second level semiconductor bear chip 2. The address signal electrode pad A3 on the top surface of the second level semiconductor bear chip 2 is connected through the through hole to the address signal electrode pad A3 on the bottom surface of the second level semiconductor bear chip 2. The connective bump 8 is provided on the address signal electrode pad A3 on the top surface of the second level semiconductor bear chip 2 at a position displaced by "L" from the through hole. The address signal electrode pad A3 on the bottom surface of the third level semiconductor bear chip 3 is connected through the connective bump 8 to the address signal electrode pad A3 on the top surface of the second level semiconductor bear chip 2. The address signal electrode pad A3 on the bottom surface of the third level semiconductor bear chip 3 is of the second type pattern which is longer pattern and also is the same pattern as the address signal electrode pad A3 on the bottom surface of the first level and second level semiconductor bear chips 1 and 2. The address signal electrode pad A3 on the top surface of the third level semiconductor bear chip 3 is of the first type pattern which is shorter pattern and also the same pattern as the address signal electrode pad A3 on the top surface of the first level and second level semiconductor bear chips 1 and 2. The second side edge of the address signal electrode pad A3 on the top surface of the third level semiconductor bear chip 3 is just aligned to the second side edge of the address signal electrode pad A3 on the bottom surface of the third level semiconductor bear chip 3. The first side edge of the address signal electrode pad A3 on the top surface of the third level semiconductor bear chip 3 extends by the distance "L" from the first side edge of the address signal electrode pad A3 on the bottom surface of the third level semiconductor bear chip 3. The address signal electrode pad A3 on the top surface of the third level semiconductor bear chip 3 is connected through the through hole to the address signal electrode pad A3 on the bottom surface of the third level semiconductor bear chip 3.

The address signal electrode pad A4 on the bottom surface of the first level semiconductor bear chip 1 is of the first type pattern which is shorter pattern. The address signal electrode pad A4 on the top surface of the first level semiconductor bear chip 1 is of the second type pattern which is longer pattern. The first side edge of the address signal electrode pad A4 on the top surface of the first level semiconductor bear chip 1 is just aligned to the first side edge of the address signal electrode pad A4 on the bottom surface of the first level semiconductor bear chip 1. The second side edge of the address signal electrode pad A4 on the top surface of the first level semiconductor bear chip 1 extends by the distance "L" from the second side edge of the address signal electrode pad A4 on the bottom surface of the first level semiconductor bear chip 1. The address signal electrode pad A4 on the top surface of the first level semiconductor bear chip 1 is connected through the through hole to the address signal electrode pad A4 on the bottom surface of the first level semiconductor bear chip 1. The connective bump 8 is provided on the address signal electrode pad A4 on the top surface of the first level semiconductor bear chip 1 at a position displaced by "L" from the through hole. The address signal electrode pad A4 on the bottom surface of the second level semiconductor bear chip 2 is connected through the connective bump 8 to the address signal electrode pad A4 on the top surface of the first level semiconductor bear chip 1. The address signal electrode pad A4 on the bottom surface of the second level semiconductor bear chip 2 is of the first type pattern which is shorter pattern and also is the same pattern as the address signal electrode pad A4 on the bottom surface of the first level semiconductor bear chip 1. The address signal electrode pad A4 on the top surface of the second level semiconductor bear chip 2 is of the second type pattern which is longer pattern and also the same pattern as the address signal electrode pad A4 on the top surface of the first level semiconductor bear chip 1. The first side edge of the address signal electrode pad A4 on the top surface of the second level semiconductor bear chip 2 is just aligned to the first side edge of the address signal electrode pad A4 on the bottom surface of the second level semiconductor bear chip 2. The second side edge of the address signal electrode pad A4 on the top surface of the second level semiconductor bear chip 2 extends by the distance "L" from the second side edge of the address signal electrode pad A4 on the bottom surface of the second level semiconductor bear chip 2. The address signal electrode pad A4 on the top surface of the second level semiconductor bear chip 2 is connected through the through hole to the address signal electrode pad A4 on the bottom surface of the second level semiconductor bear chip 2. The connective bump 8 is provided on the address signal electrode pad A4 on the top surface of the second level semiconductor bear chip 2 at a position displaced by "L" from the through hole. The address signal electrode pad A4 on the bottom surface of the third level semiconductor bear chip 3 is connected through the connective bump 8 to the address signal electrode pad A4 on the top surface of the second level semiconductor bear chip 2. The address signal electrode pad A4 on the bottom surface of the third level semiconductor bear chip 3 is of the first type pattern which is shorter pattern and also is the same pattern as the address signal electrode pad A4 on the bottom surface of the first level and second level semiconductor bear chips 1 and 2. The address signal electrode pad A4 on the top surface of the third level semiconductor bear chip 3 is of the second type pattern which is longer pattern and also the same pattern as the address signal electrode pad A4 on the top surface of the first level and second level semiconductor bear chips 1 and 2. The first side edge of the address signal electrode pad A4 on the top surface of the third level semiconductor bear chip 3 is just aligned to the first side edge of the address signal electrode pad A4 on the bottom surface of the third level semiconductor bear chip 3. The second side edge of the address signal electrode pad A4 on the top surface of the third level semiconductor bear chip 3 extends by the distance "L" from the second side edge of the address signal electrode pad A4 on the bottom surface of the third level semiconductor bear chip 3. The address signal electrode pad A4 on the top surface of the third level semiconductor bear chip 3 is connected through the through hole to the address signal electrode pad A4 on the bottom surface of the third level semiconductor bear chip 3.

The address signal electrode pad A5 on the bottom surface of the first level semiconductor bear chip 1 is of the second type pattern which is longer pattern. The address signal electrode pad A5 on the top surface of the first level semiconductor bear chip 1 is of the first type pattern which is shorter pattern. The second side edge of the address signal electrode pad A5 on the top surface of the first level semiconductor bear chip 1 is just aligned to the second side edge of the address signal electrode pad A5 on the bottom surface of the first level semiconductor bear chip 1. The first side edge of the address signal electrode pad A5 on the top surface of the first level semiconductor bear chip 1 extends by the distance "L" from the first side edge of the address signal electrode pad A5 on the bottom surface of the first level semiconductor bear chip 1. The address signal electrode pad A5 on the top surface of the first level semiconductor bear chip 1 is connected through the through hole to the address signal electrode pad A5 on the bottom surface of the first level semiconductor bear chip 1. The connective bump 8 is provided on the address signal electrode pad A5 on the top surface of the first level semiconductor bear chip 1 at a position displaced by "L" from the through hole. The address signal electrode pad A5 on the bottom surface of the second level semiconductor bear chip 2 is connected through the connective bump 8 to the address signal electrode pad A5 on the top surface of the first level semiconductor bear chip 1. The address signal electrode pad A5 on the bottom surface of the second level semiconductor bear chip 2 is of the second type pattern which is longer pattern and also is the same pattern as the address signal electrode pad A5 on the bottom surface of the first level semiconductor bear chip 1. The address signal electrode pad A5 on the top surface of the second level semiconductor bear chip 2 is of the first type pattern which is shorter pattern and also the same pattern as the address signal electrode pad A5 on the top surface of the first level semiconductor bear chip 1. The second side edge of the address signal electrode pad A5 on the top surface of the second level semiconductor bear chip 2 is just aligned to the second side edge of the address signal electrode pad A5 on the bottom surface of the second level semiconductor bear chip 2. The first side edge of the address signal electrode pad A5 on the top surface of the second level semiconductor bear chip 2 extends by the distance "L" from the first side edge of the address signal electrode pad A5 on the bottom surface of the second level semiconductor bear chip 2. The address signal electrode pad A5 on the top surface of the second level semiconductor bear chip 2 is connected through the through hole to the address signal electrode pad A5 on the bottom surface of the second level semiconductor bear chip 2. The connective bump 8 is provided on the address signal electrode pad A5 on the top surface of the second level semiconductor bear chip 2 at a position displaced by "L" from the through hole. The address signal electrode pad A5 on the bottom surface of the third level semiconductor bear chip 3 is connected through the connective bump 8 to the address signal electrode pad A5 on the top surface of the second level semiconductor bear chip 2. The address signal electrode pad A5 on the bottom surface of the third level semiconductor bear chip 3 is of the second type pattern which is longer pattern and also is the same pattern as the address signal electrode pad A5 on the bottom surface of the first level and second level semiconductor bear chips 1 and 2. The address signal electrode pad A5 on the top surface of the third level semiconductor bear chip 3 is of the first type pattern which is shorter pattern and also the same pattern as the address signal electrode pad A5 on the top surface of the first level and second level semiconductor bear chips 1 and 2. The second side edge of the address signal electrode pad A5 on the top surface of the third level semiconductor bear chip 3 is just aligned to the second side edge of the address signal electrode pad A5 on the bottom surface of the third level semiconductor bear chip 3. The first side edge of the address signal electrode pad A5 on the top surface of the third level semiconductor bear chip 3 extends by the distance "L" from the first side edge of the address signal electrode pad AS on the bottom surface of the third level semiconductor bear chip 3. The address signal electrode pad A5 on the top surface of the third level semiconductor bear chip 3 is connected through the through hole to the address signal electrode pad A5 on the bottom surface of the third level semiconductor bear chip 3.

The data signal electrode pads have the same structure as described above and shown in FIG. 6.

As a modification, in place of the through holes, the pads on the top and bottom surfaces of each of the first level, second level and third level semiconductor bear chips 1, 2 and 3 are connected through interconnections of each of the first level, second level and third level semiconductor bear chips 1, 2 and 3.

As described above, the first level, second level and third level semiconductor bear chips 1, 2 and 3 are identical with each other in the patterns of all of the electrode pads. Each of the electrode pads is common in pattern to individuals of the first level, second level and third level semiconductor bear chips 1, 2 and 3. This means that the patterns of all of the electrode pads may commonly be designed to individuals of the first level, second level and third level semiconductor bear chips 1, 2 and 3. This further means that the signal interconnection patterns are also common to the individuals of the first level, second level and third level semiconductor bear chips 1, 2 and 3. Accordingly, the chip design may be made independent from the individuals of the first level, second level and third level semiconductor bear chips 1, 2 and 3.

Further, the positions or layouts of the connective bumps are also common to the individuals of the first level, second level and third level semiconductor bear chips 1, 2 and 3. The design for layouts of the connective bumps may also commonly be made to the individuals of the first level, second level and third level semiconductor bear chips 1, 2 and 3.

The processes for forming all of the electrode pads, interconnections and connective pads may be made common to the individuals of the first level, second level and third level semiconductor bear chips 1, 2 and 3.

As shown in FIG. 7, the required test for certain connections between the first level, second level and third level semiconductor bear chips 1, 2 and 3 may be made by use of the test probe 20. The first level, second level and third level semiconductor bear chips 1, 2 and 3 are displaced so that the first chip select pads 61 on the top surfaces of the first level, second level and third level semiconductor bear chips 1, 2 and 3 are opened and uncovered, so as to allow the test probe 20 to be made into contact with the first chip select pads 61 easily even if the gap of the first level, second level and third level semiconductor bear chips 1, 2 and 3 is extremely narrow.

Figure 8:
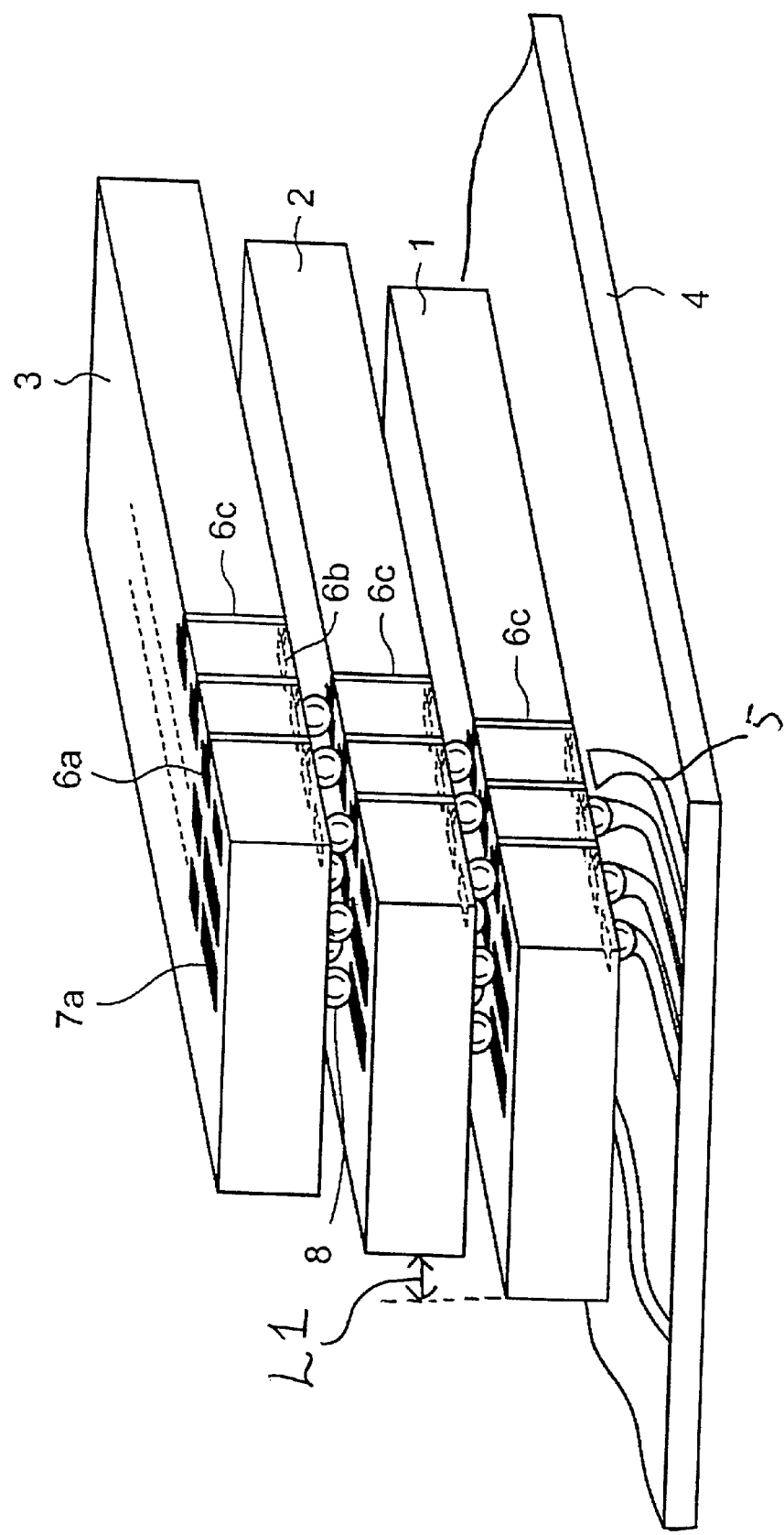
FIG. 8 is a schematic perspective view illustrative of a novel semiconductor device having an improved multilevel stacked semiconductor bear chip structure over a substrate in a modification to the above preferred embodiment in accordance with the present invention.

FIG. 8 is a schematic perspective view illustrative of a novel semiconductor device having an improved multilevel stacked semiconductor bear chip structure over a substrate in a modification to the above preferred embodiment in accordance with the present invention.

The improved multilevel structure of the novel semiconductor device comprises three stacked semiconductor bear chips 1, 2 and 3 over a substrate 4. Namely, a first level semiconductor bear chip 1 is provided over the substrate 4. A second level semiconductor bear chip 2 is also provided over the first level semiconductor bear chip 1. A third level semiconductor bear chip 3 is also provided over the second level semiconductor bear chip 2. Each of the first level, second level and third level semiconductor bear chips 1, 2 and 3 may comprise a memory bear chip such as DRAM. The first level, second level and third level semiconductor bear chips 1, 2 and 3 are the same in size, external electrode patterns and interconnection patterns. The interconnection patterns include internal interconnections extending from the external electrodes and semiconductor circuit patterns. The first level, second level and third level semiconductor bear chips 1, 2 and 3 are stacked over the substrate 4 so that the first level, second level and third level semiconductor bear chips 1, 2 and 3 are not aligned and displaced in a direction parallel to a longitudinal direction of the first level, second level and third level semiconductor bear chips 1, 2 and 3. The one side edge of the second level semiconductor bear chip 2 is displaced by a distance "L1" from the one side edge of the first level semiconductor bear chip 1. Further, the one side edge of the third level semiconductor bear chip 3 is displaced by the distance "L1" from the one side edge of the second level semiconductor bear chip 2.

Plural interconnections 5 extend over the top surface of the substrate 4. The interconnections 5 comprise a first interconnection for transmitting a first level semiconductor bear chip selecting signal S1 to select the first level semiconductor bear chip 1, a second interconnection for transmitting a second level semiconductor bear chip selecting signal S2 to select the second level semiconductor bear chip 2, a third interconnection for transmitting a third level semiconductor bear chip selecting signal S3 to select the third level semiconductor bear chip 3, and other interconnections for transmitting address signals and data signals to the first level, second level and third level semiconductor bear chips 1, 2 and 3.

The first level semiconductor bear chip 1 has a bottom surface which has a first level bottom surface array of plural signal pads 7b and a first level bottom surface single alignment of four chip select pads 6b. The bottom surface of the first level semiconductor bear chip 1 has a first level array of connective bumps 8 which are in contact with the first level bottom surface array of the plural signal pads 7b and the first level bottom surface single alignment of the four chip select pads 6b and also in contact with the interconnections 5 extending over the top surface of the substrate 4, so that the first level bottom surface array of the plural signal pads 7b and the first level bottom surface single alignment of the four chip select pads 6b are electrically connected through the connective bumps 8 to the interconnections 5 extending over the top surface of the substrate 4. The connective bumps 8 may comprise metal bumps such as solder bumps and gold bumps. The first level semiconductor bear chip 1 has a top surface which has a first level top surface array of plural signal pads 7a and a first level top surface single alignment of four chip select pads 6a.

The second level semiconductor bear chip 2 has a bottom surface which has a second level bottom surface array of plural signal pads 7b and a second level bottom surface single alignment of four chip select pads 6b. The bottom surface of the second level semiconductor bear chip 2 has a second level array of connective bumps 8 which are in contact with the second level bottom surface array of the plural signal pads 7b and the second level bottom surface single alignment of the four chip select pads 6b and also in contact with the first level top surface array of plural signal pads 7a and the first level top surface single alignment of four chip select pads 6a of the first level semiconductor bear chip 1, so that the second level bottom surface array of the plural signal pads 7b and the second level bottom surface single alignment of the four chip select pads 6b are electrically connected through the second level array of the connective bumps 8 to the first level top surface array of plural signal pads 7a and the first level top surface single alignment of four chip select pads 6a of the first level semiconductor bear chip 1. The connective bumps 8 may comprise metal bumps such as solder bumps and gold bumps. The second level semiconductor bear chip 2 has a top surface which has a second level top surface array of plural signal pads 7a and a second level top surface single alignment of four chip select pads 6a.

The third level semiconductor bear chip 3 has a bottom surface which has a third level bottom surface array of plural signal pads 7b and a third level bottom surface single alignment of four chip select pads 6b. The bottom surface of the third level semiconductor bear chip 3 has a third level array of connective bumps 8 which are in contact with the third level bottom surface array of the plural signal pads 7b and the third level bottom surface single alignment of the four chip select pads 6b and also in contact with the second level top surface array of plural signal pads 7a and the second level top surface single alignment of four chip select pads 6a of the second level semiconductor bear chip 2, so that the third level bottom surface array of the plural signal pads 7b and the third level bottom surface single alignment of the four chip select pads 6b are electrically connected through the third level array of the connective bumps 8 to the second level top surface array of plural signal pads 7a and the second level top surface single alignment of four chip select pads 6a of the second level semiconductor bear chip 2. The connective bumps 8 may comprise metal bumps such as solder bumps and gold bumps. The third level semiconductor bear chip 3 has a top surface which has a third level top surface array of plural signal pads 7a and a third level top surface single alignment of four chip select pads 6a.

Each of the first level, second level and third level top surface arrays of the plural signal pads 7a comprises dual alignments of the signal pads 7a. Each of the first level, second level and third level top surface single alignments of the four chip select pads 6a comprises a single alignment of the four chip select pads 6a. The dual alignments of the signal pads 7a further comprise plural address signal electrode pads A0, A1, A2, A3, A4 - - - , data signal electrode pads D1, D2, D3, D4, D5, D6, D7 and D8, a power electrode pad Vcc and a ground pad G as well as other electrode pads. The single alignment of the four chip select pads 6a further comprises a first chip select pad 61a, a second chip select pad 62a, a third chip select pad 63a, and a fourth chip select pad 64a which are aligned at a constant pitch "L1".

If the first chip select pad 61a receives the chip select signal, then the semiconductor bear chip is selected and activated. If the second chip select pad 62a receives the chip select signal, then the semiconductor bear chip is unselected and inactivated. If the third chip select pad 63a receives the chip select signal, then the semiconductor bear chip is unselected and inactivated. If the fourth chip select pad 64a receives the chip select signal, then the semiconductor bear chip is unselected and inactivated. Only when the chip select signal enters into the first chip select pad 61a, then the semiconductor bear chip is selected and activated.

Each of the first level, second level and third level bottom surface arrays of the plural signal pads 7b comprises dual alignments of the signal pads 7b. Each of the first level, second level and third level bottom surface single alignments of the four chip select pads 6b comprises a single alignment of the four chip select pads 6b. The dual alignments of the signal pads 7b further comprise plural address signal electrode pads A0, A1, A2, A3, A4 - - - , data signal electrode pads D1, D2, D3, D4, D5, D6, D7 and D8, a power electrode pad Vcc and a ground pad G as well as other electrode pads. The single alignment of the four chip select pads 6b further comprises a first chip select pad 61b, a second chip select pad 62b, a third chip select pad 63b, and a fourth chip select pad 64b which are aligned at a constant pitch "L1".

If the first chip select pad 61b receives the chip select signal, then the semiconductor bear chip is selected and activated. If the second chip select pad 62b receives the chip select signal, then the semiconductor bear chip is unselected and inactivated. If the third chip select pad 63b receives the chip select signal, then the semiconductor bear chip is unselected and inactivated. If the fourth chip select pad 64b receives the chip select signal, then the semiconductor bear chip is unselected and inactivated. Only when the chip select signal enters into the first chip select pad 61*b*, then the semiconductor bear chip is selected and activated.

The first level, second level and third level semiconductor bear chips 1, 2 and 3 are stacked over the substrate 4 so that the first level, second level and third level semiconductor bear chips 1, 2 and 3 are not aligned and displaced in a direction parallel to a longitudinal direction of the first level, second level and third level semiconductor bear chips 1, 2 and 3. The one side edge of the second level semiconductor bear chip 2 is displaced by a distance "L1" from the one side edge of the first level semiconductor bear chip 1. Further, the one side edge of the third level semiconductor bear chip 3 is displaced by the distance "L1" from the one side edge of the second level semiconductor bear chip 2.

The first chip select pad 61*b* on the bottom surface of the first level semiconductor bear chip 1 is connected through an interconnection pattern 6*c* to the first chip select pad 61*a* on the top surface of the first level semiconductor bear chip 1. The interconnection pattern 6*c* extends on a side wall of the first level semiconductor bear chip 1 to connect between the first chip select pad 61*b* on the bottom surface and the first chip select pad 61*a* on the top surface. The first level semiconductor bear chip selecting signal S1 is applied to the first chip select pad 61*b* on the bottom surface of the first level semiconductor bear chip 1 and then transmitted through the interconnection pattern 6*c* to the first chip select pad 61*a* on the top surface of the first level semiconductor bear chip 1. Since the first chip select pad 61*a* on the top surface of the first level semiconductor bear chip 1 receives the first level semiconductor bear chip selecting signal S1, then the first level semiconductor bear chip 1 is activated.

The second chip select pad 62*b* on the bottom surface of the first level semiconductor bear chip 1 is connected through an interconnection pattern 6*c* to the second chip select pad 62*a* on the top surface of the first level semiconductor bear chip 1. The interconnection pattern 6*c* extends on a side wall of the first level semiconductor bear chip 1 to connect between the second chip select pad 62*b* on the bottom surface and the second chip select pad 62*a* on the top surface. The second chip select pad 62*a* on the top surface of the first level semiconductor bear chip 1 is further connected through the connective bump 8 to the first chip select pad 61*b* on the bottom surface of the second level semiconductor bear chip 2. The first chip select pad 61*b* on the bottom surface of the second level semiconductor bear chip 2 is further connected through an interconnection pattern 6*c* to the first chip select pad 61*a* on the top surface of the second level semiconductor bear chip 2. The interconnection pattern 6*c* extends on a side wall of the second level semiconductor bear chip 2 to connect between the first chip select pad 61*b* on the bottom surface and the first chip select pad 61*a* on the top surface. The second level semiconductor bear chip selecting signal S2 is applied to the second chip select pad 62*b* on the bottom surface of the first level semiconductor bear chip 1 and then transmitted through the interconnection pattern 6*c* to the second chip select pad 62*a* on the top surface of the first level semiconductor bear chip 1. Since the second chip select pad 62*a* on the top surface of the first level semiconductor bear chip 1 receives the second level semiconductor bear chip selecting signal S2, then the first level semiconductor bear chip 1 is inactivated. However, the second level semiconductor bear chip selecting signal S2 is further transmitted through the connective bump 8 to the first chip select pad 61*b* on the bottom surface of the second level semiconductor bear chip 2 and then transmitted through the interconnection pattern 6*c* to the first chip select pad 61*a* on the top surface of the second level semiconductor bear chip 1. Since the first chip select pad 61*a* on the top surface of the second level semiconductor bear chip 2 receives the second level semiconductor bear chip selecting signal S2, then the first level semiconductor bear chip 2 is activated.

The third chip select pad 63*b* on the bottom surface of the first level semiconductor bear chip 1 is connected through an interconnection pattern 6*c* to the third chip select pad 63*a* on the top surface of the first level semiconductor bear chip 1. The interconnection pattern 6*c* extends on a side wall of the first level semiconductor bear chip 1 to connect between the third chip select pad 63*b* on the bottom surface and the third chip select pad 63*a* on the top surface. The third chip select pad 63*a* on the top surface of the first level semiconductor bear chip 1 is further connected through the connective bump 8 to the second chip select pad 62*b* on the bottom surface of the second level semiconductor bear chip 2. The second chip select pad 62*b* on the bottom surface of the second level semiconductor bear chip 2 is further connected through an interconnection pattern 6*c* to the second chip select pad 62*a* on the top surface of the second level semiconductor bear chip 2. The interconnection pattern 6*c* extends on a side wall of the second level semiconductor bear chip 2 to connect between the second chip select pad 62*b* on the bottom surface and the second chip select pad 62*a* on the top surface. The second chip select pad 62*a* on the top surface of the second level semiconductor bear chip 2 is further connected through the connective bump 8 to the first chip select pad 61*b* on the bottom surface of the third level semiconductor bear chip 3. The first chip select pad 61*b* on the bottom surface of the third level semiconductor bear chip 3 is further connected through an interconnection pattern 6*c* to the first chip select pad 61*a* on the top surface of the third level semiconductor bear chip 3. The interconnection pattern 6*c* extends on a side wall of the third level semiconductor bear chip 3 to connect between the first chip select pad 61*b* on the bottom surface and the first chip select pad 61*a* on the top surface. The third level semiconductor bear chip selecting signal S3 is applied to the third chip select pad 63*b* on the bottom surface of the first level semiconductor bear chip 1 and then transmitted through the interconnection pattern 6*c* to the third chip select pad 63*a* on the top surface of the first level semiconductor bear chip 1. Since the third chip select pad 63*a* on the top surface of the first level semiconductor bear chip 1 receives the third level semiconductor bear chip selecting signal S3, then the first level semiconductor bear chip 1 is inactivated. The third level semiconductor bear chip selecting signal S3 is further transmitted through the connective bump 8 to the second chip select pad 62*b* on the bottom surface of the second level semiconductor bear chip 2 and then transmitted through the interconnection pattern 6*c* to the second chip select pad 62*a* on the top surface of the second level semiconductor bear chip 2. Since the second chip select pad 62*a* on the top surface of the second level semiconductor bear chip 2 receives the third level semiconductor bear chip selecting signal S3, then the second level semiconductor bear chip 2 is inactivated. However, the third level semiconductor bear chip selecting signal S3 is further more transmitted through the connective bump 8 to the first chip select pad 61*b* on the bottom surface of the third level semiconductor bear chip 3 and then transmitted through the interconnection pattern 6*c* to the first chip select pad 61*a* on the top surface of the third level semiconductor bear chip 3. Since the first chip select pad 61*a* on the top surface of the third level semiconductor bear chip 3 receives the third level semiconductor bear chip selecting signal S3, then the third level semiconductor bear chip 3 is activated.

The other structure than what have been described above are the same as in the preferred embodiment.

Accordingly, in the modified embodiment, the chip select pads 6a on the top surface of each of the first level, second level and third level semiconductor bear chips 1, 2 and 3 and the chip select pads 6b on the bottom surface of each of the first level, second level and third level semiconductor bear chips 1, 2 and 3 are connected through the interconnection patterns 6c extends on the side wall of each of the first level, second level and third level semiconductor bear chips 1, 2 and 3.

As described above, the first level, second level and third level semiconductor bear chips 1, 2 and 3 are identical with each other in the patterns of all of the electrode pads. Each of the electrode pads is common in pattern to individuals of the first level, second level and third level semiconductor bear chips 1, 2 and 3. This means that the patterns of all of the electrode pads may commonly be designed to individuals of the first level, second level and third level semiconductor bear chips 1, 2 and 3. This further means that the signal interconnection patterns are also common to the individuals of the first level, second level and third level semiconductor bear chips 1, 2 and 3. Accordingly, the chip design may be made independent from the individuals of the first level, second level and third level semiconductor bear chips 1, 2 and 3.

Further, the positions or layouts of the connective bumps are also common to the individuals of the first level, second level and third level semiconductor bear chips 1, 2 and 3. The design for layouts of the connective bumps may also commonly be made to the individuals of the first level, second level and third level semiconductor bear chips 1, 2 and 3.

The processes for forming all of the electrode pads, interconnections and connective pads may be made common to the individuals of the first level, second level and third level semiconductor bear chips 1, 2 and 3.

The required test for certain connections between the first level, second level and third level semiconductor bear chips 1, 2 and 3 may be made by use of the test probe 20. The first level, second level and third level semiconductor bear chips 1, 2 and 3 are displaced so that the first chip select pads 61 on the top surfaces of the first level, second level and third level semiconductor bear chips 1, 2 and 3 are opened and uncovered, so as to allow the test probe 20 to be made into contact with the first chip select pads 61 easily even if the gap of the first level, second level and third level semiconductor bear chips 1, 2 and 3 is extremely narrow.

In the foregoing embodiments, the signal pads 7a on the top surface of each of the first level, second level and third level semiconductor bear chips 1, 2 and 3 and the signal pads 7b on the bottom surface of each of the first level, second level and third level semiconductor bear chips 1, 2 and 3 are aligned in the form of the dual lines along the longitudinal center axis of each of the first level, second level and third level semiconductor bear chips 1, 2 and 3. It is, however, possible as a modification that the signal pads 7a on the top surface of each of the first level, second level and third level semiconductor bear chips 1, 2 and 3 and the signal pads 7b on the bottom surface of each of the first level, second level and third level semiconductor bear chips 1, 2 and 3 are aligned in the form of the dual lines but along the longitudinal sides of each of the first level, second level and third level semiconductor bear chips 1, 2 and 3. In this modification, it is further possible that the signal pads 7a on the top surface of each of the first level, second level and third level semiconductor bear chips 1, 2 and 3 and the signal pads 7b on the bottom surface of each of the first level, second level and third level semiconductor bear chips 1, 2 and 3 are connected through interconnections extending on the side wall of each of the first level, second level and third level semiconductor bear chips 1, 2 and 3.

In the foregoing embodiments, the signal pads 7a and the chip select pads 6a on the top surface of each of the first level, second level and third level semiconductor bear chips 1, 2 and 3 are aligned in parallel to each other Also, the signal pads 7b and the chip select pads 6b on the bottom surface of each of the first level, second level and third level semiconductor bear chips 1, 2 and 3 are aligned in parallel to each other. It is, however, possible as a modification that the signal pads 7a and the chip select pads 6a on the top surface of each of the first level, second level and third level semiconductor bear chips 1, 2 and 3 are aligned in parallel to each other. Also, the signal pads 7b and the chip select pads 6b on the bottom surface of each of the first level, second level and third level semiconductor bear chips 1, 2 and 3 are aligned in unparallel to each other, provided that adjacent two of the first level, second level and third level semiconductor b ear chips 1, 2 and 3 are displaced by the distance "L" which corresponds to the pitch "L" of the alignment of the plural chip select pads 6a and 6b and in the direction parallel to the alignment of the plural chip select pads 6a and 6b as well as provided that the connective bumps 8 on the signal pads 7a and 7b connected to each other to make a pair and provided on the top and bottom surfaces of each of the first level, second level and third level semiconductor bear chips 1, 2 and 3 is displaced by the distance "L" which corresponds to the pitch "L" of the alignment of the plural chip select pads 6a and 6b and in the direction parallel to the alignment of the plural chip select pads 6a and 6b.

In the foregoing embodiments, the signal pads 7a on the top surface and the signal pads 7b on the bottom surface of each of the first level, second level and third level semiconductor bear chips 1, 2 and 3 are identical with each other in patterns or layout and shape. It is, however, possible as a modification that the signal pads 7a on the top surface and the signal pads 7b on the bottom surface of each of the first level, second level and third level semiconductor bear chips 1, 2 and 3 are different from each other in patterns or Layout and shape, provided that the connective bumps 8 on the signal pads 7a and 7b connected to each other to make a pair and provided on the top and bottom surfaces of each of the first level, second level and third level semiconductor bear chips 1, 2 and 3 are displaced by the distance "L" which corresponds to the pitch "L" of the alignment of the plural chip select pads 6a and 6b and in the direction parallel to the alignment of the plural chip select pads 6a and 6b.

In the foregoing embodiments, the signal pads 7a and the chip select pads 6a on the top surface are common to the first level, second level and third level semiconductor bear chips 1, 2 and 3, whilst the signal pads 7b and the chip select pads 6b on the bottom surface are common to the first level, second level and third level semiconductor bear chips 1, 2 and 3.

In the foregoing embodiments, each of the first level, second level and third level semiconductor bear chips 1, 2 and 3 comprises the memory bear chip. It is, of course, possible as a modification that each of the first level, second level and third level semiconductor bear chips 1, 2 and 3 comprises the other semiconductor bear chip such as CPU.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device comprising a plurality of semiconductor bear chips staked over a substrate with a constant displacement in a first direction, each of said semiconductor bear chips having top and bottom surfaces, each of said top and bottom surfaces of each of said semiconductor bear chops having both plural signal pads and plural chip select pads, wherein said plural chip select pads are aligned at a constant pitch in said fist direction corresponding to said constant displacement, and adjacent two of said plural semiconductor bear chips are displaced by a first distance corresponding to said constant pitch in said first direction.

2. The semiconductor device as claimed in claim 1, wherein said plural chip select pads and said plural signal pads on said top surface of lower one of said adjacent two of said plural semiconductor bear chips are connected through electrically connective members to said plural chip select pads and said plural signal pads on said bottom surface of upper one of said adjacent two of said plural semiconductor bear chips, and wherein said electrically connective members in contact with said plural signal pads on said top surface of each of said plural semiconductor bear chips are displaced by said first distance in said first direction from said electrically connective members in contact with said plural signal pads on said bottom surface of said each of said plural semiconductor bear chips.

3. The semiconductor device as claimed in claim 2, wherein said electrically connective members comprise connective bumps.

4. The semiconductor device as claimed in claim 1, wherein said plural chip select pads and said plural signal pads on said top surface are common in pattern and layout among said plural semiconductor bear chips, whilst said plural chip select pads and said plural signal pads on said bottom surface are common in pattern and layout among said plural semiconductor bear chips.

5. The semiconductor device as claimed in claim 4, wherein said plural chip select pads and said plural signal pads are common in pattern and layout between said top and bottom surfaces of each of said plural semiconductor bear chips.

6. The semiconductor device as claimed in claim 4, wherein said plural chip select pads and said plural signal pads are different in pattern and layout between said top and bottom surfaces of each of said plural semiconductor bear chips.

7. The semiconductor device as claimed in claim 1, wherein, in each of said plural semiconductor bear chips, said plural chip select pads on said top surface and said plural chip select pads on said bottom surface are connected to each other through via contacts provided in said each of said plural semiconductor bear chips.

8. The semiconductor device as claimed in claim 1, wherein, in each of said plural semiconductor bear chips, said plural chip select pads on said top surface and said plural chip select pads on said bottom surface are connected to each other through interconnections provided on one side wall of said each of said plural semiconductor bear chips.

9. The semiconductor device as claimed in claim 1, wherein in each of said plural signal pads on a first center region of said top surface and said plural signal pads on a second center region of said bottom surface are connected to each other through via contacts provided in said each of said plural semiconductor bear chips.

10. The semiconductor device as claimed in claim 1, wherein, in each of said plural semiconductor bear chips, said plural chip select pads on a first side region of said top surface and said plural chip select pads on a second side region of said bottom surface are connected to each other through interconnections provided on one side wall of said each of said plural semiconductor bear chips, and said first and second side regions are adjacent to said one side wall.

11. The semiconductor device as claimed in claim 1, wherein, in each of said plural semiconductor bear chips, said plural chip select pads on said top surface and said plural chip select pads on said bottom surface are connected to each other through internal interconnections provided within said each of said plural semiconductor bear chips.

12. The semiconductor device as claimed in claim 1, wherein, each of said plural semiconductor bear chips, said plural signal pads on a first center region of said top surface and said plural signal pads on a second center region of said bottom surface are connected to each other through internal interconnections provided within said each of said plural semiconductor bear chips.

13. The semiconductor device as claimed in claim 1, wherein the number of said plural chip select pads is not less than the number of said plural semiconductor bear chips.

14. The semiconductor device as claimed in claim 1, wherein each of said plural semiconductor bear chips is activated upon applying a chip select signal to first-end one of said plural chip select pads, and said first-end one is closest to a first side of said each of said plural semiconductor bear chips, and said first side extends vertical to said first direction and is positioned opposite to said first direction, so that said first-end one of said plural chip select pads is uncovered by upper one of said plural semiconductor bear chips, whilst remaining ones of said plural chip select pads are covered by said upper one of said plural semiconductor bear chips.

15. A semiconductor device comprising a plurality of semiconductor bear chips staked over a substrate, each of said semiconductor bear chips having top and bottom surfaces, each of said top and bottom surfaces of each of said semiconductor bear chips having both plural signal pads and plural chip select pads, wherein said plural chip select pads and said plural signal pads on said top surface of lower one of said adjacent two of said plural semiconductor bear chips are connected through electrically connective members to said plural chip select pads and said plural signal pads on said bottom surface of upper one of said adjacent two of said plural semiconductor bear chips, and wherein said electrically connective members in contact with said plural signal pads on said top surface of each of said plural semiconductor bear chips are displaced by said first distance in said first direction from said electrically connective members in contact with said plural signal pads on said bottom surface of said each of said plural semiconductor bear chips, wherein said plural chip select pads and said plural signal pads on said top surface are common in pattern and layout among said plural semiconductor bear chips, whilst said plural chip select pads and said plural signal pads on said bottom surface are common in pattern and layout among said plural semiconductor bear chips, and wherein said plural chip select pads are aligned at a constant pitch in a first direction, and adjacent two of said plural semiconductor bear chips are displaced by a first distance corresponds to said constant pitch in said first direction.

16. The semiconductor device as claimed in claim 15, wherein said electrically connective members comprise connective bumps.

17. The semiconductor device as claimed in claim 15, wherein said plural chip select pads and said plural signal pads are common in pattern and layout between said top and bottom surfaces of each of said plural semiconductor bear chips.

18. The semiconductor device as claimed in claim 15, wherein said plural chip select pads and said plural signal pads are different in pattern and layout between said top and bottom surfaces of each of said plural semiconductor bear chips.

19. The semiconductor device as claimed in claim 15, wherein, in each of said plural semiconductor bear chips, said plural chip select pads on said top surface and said plural chip select pads on said bottom surface are connected to each other through via contacts provided in said each of said plural semiconductor bear chips.

20. The semiconductor device as claimed in claim 15, wherein, in each of said plural semiconductor bear chips, said plural chip select pads on said top surface and said plural chip select pads on said bottom surface are connected to each other through interconnections provided on one side wall of said each of said plural semiconductor bear chips.

21. The semiconductor device as claim in claim 15, wherein, in each of said plural semiconductor bear chips, said plural signal pads on a first center region of said top surface and said plural signal pads on a second center region of said bottom surface are connected to each other through via contacts provided in said each of said plural semiconductor bear chips.

22. The semiconductor device as claimed in claim 15, wherein, in each of said plural semiconductor bear chips, said plural chip select pads on a first side region of said top surface and said plural chip select pads on a second side region of said bottom surface are connected to each other through interconnections provided on one side wall of said each of said plural semiconductor bear chips, and said first and second side regions are adjacent to said one side wall.

23. The semiconductor device as claimed in claim 15, wherein, in each of said plural semiconductor bear chips, said plural chip select pads on said top surface and said plural chip select pads on said bottom surface are connected to each other through internal interconnections provided within said each of said plural semiconductor bear chips.

24. The semiconductor device as claimed in claim 15, wherein, in each of said plural semiconductor bear chips, said plural signal pads on a first center region of said top surface and said plural signal pads on a second center region of said bottom surface are connected to each other through internal interconnections provided within said each of said plural semiconductor bear chips.

25. The semiconductor device as claimed in claim 15, wherein the number of said plural chip select pads is not less than the number of said plural semiconductor bear chips.

26. The semiconductor device as claimed in claim 15, wherein each of said plural semiconductor bear chips is activated upon applying a chip select signal to first-end one of said plural chip select pads, and said first-end one is closest to a first side of said each of said plural semiconductor bear chips, and said first side extends vertical to said first direction and is positioned opposite to said first direction, so that said first-end one of said plural chip select pads is uncovered by upper one of said plural semiconductor bear chips, whilst remaining ones of said plural chip select pads are covered by said upper one of said plural semiconductor bear chips.

* * * * *